(12) United States Patent
Chen et al.

(10) Patent No.: US 11,967,919 B2
(45) Date of Patent: Apr. 23, 2024

(54) PHOTOVOLTAIC BUILDING MATERIAL WITH ABILITY OF SAFE ELECTRIC POWER GENERATION

(71) Applicant: Accelenergy Power Pte. Ltd., Oue Downtown (SG)

(72) Inventors: Tsung-Hsin Chen, Taipei (TW); Yong-Xiang Cui, Chengdu (CN); Keh-Tao Liu, Taipei (TW); Hisayoshi Kobayashi, Tokyo (JP)

(73) Assignee: Accelenergy Power Pte. Ltd., Oue Downtown (SG)

( * ) Notice: Subject to any disclaimer, the term of this patent is extended or adjusted under 35 U.S.C. 154(b) by 71 days.

(21) Appl. No.: 17/365,458

(22) Filed: Jul. 1, 2021

(65) Prior Publication Data

US 2022/0014142 A1    Jan. 13, 2022

(51) Int. Cl.
*H02S 20/25* (2014.01)
*H01L 31/048* (2014.01)
(Continued)

(52) U.S. Cl.
CPC .......... *H02S 20/25* (2014.12); *H01L 31/0488* (2013.01); *H02S 10/12* (2014.12); *H02S 40/10* (2014.12)

(58) Field of Classification Search
CPC ............... H02S 20/22–26; H02S 10/40; H02S 20/25–26
See application file for complete search history.

(56) References Cited

U.S. PATENT DOCUMENTS

| 2007/0176431 A1* | 8/2007 | Graham, Sr. ............. F03D 9/34 290/55 |
| 2008/0005985 A1* | 1/2008 | Lin ........................ E04H 9/14 52/272 |

(Continued)

FOREIGN PATENT DOCUMENTS

| CN | 109412527 A | * | 3/2019 | ............. H02S 20/23 |
| CN | 208738279 U | * | 4/2019 | ............. F24S 25/61 |
| KR | 1551727 B1 | * | 9/2015 | |

OTHER PUBLICATIONS

English machine translation of Kim (KR-1551727-B1) provided by the KIPO website, 2022, All Pages. (Year: 2022).*

(Continued)

*Primary Examiner* — Daniel P Malley, Jr.
(74) *Attorney, Agent, or Firm* — Bradley J. Thorson; DeWitt LLP

(57) ABSTRACT

A photovoltaic building material, which can safely generate electric power with solar power energy is disclosed. The photovoltaic building material can be used as building material, and can be directly installed on the fixed part of the building, such as roof, wall or decoration materials on the surface of building. The photovoltaic building material is accord with the architectural requirements of waterproof, fireproof, load-carrying ability, durability and heat-insulation. When this invention is installed on the roof, the automatic spraying device can be set up on the height of ridge, which realizes the functions of roof cleaning and cooling down by the automatic water spraying. Also, with the auxiliary device, this invention can intensify the ability to withstand strong winds for roof, and can ensure safety in the typhoon/hurricane area.

18 Claims, 25 Drawing Sheets

(51) Int. Cl.
*H02S 10/12* (2014.01)
*H02S 40/10* (2014.01)

(56) References Cited

U.S. PATENT DOCUMENTS

| | | | | |
|---|---|---|---|---|
| 2010/0242381 A1* | 9/2010 | Jenkins | .................. | H02S 20/25 |
| | | | | 52/173.3 |
| 2016/0087575 A1* | 3/2016 | Keenihan | ............... | H02S 20/25 |
| | | | | 136/251 |
| 2017/0077866 A1* | 3/2017 | MacDonald | ............ | H02S 20/23 |
| 2020/0119212 A1* | 4/2020 | Cui | ........................ | F24S 25/61 |

OTHER PUBLICATIONS

English machine translation of Wang (CN-109412527-A) provided by the EPO website, 2022, All Pages. (Year: 2022).*
English machine translation of Cui (CN-208738279-U) provided by the EPO website, 2022, All Pages. (Year: 2022).*
English machine translation of CUI (CN-208738279-U) provided by the EPO website, 2023, All Pages. (Year: 2023).*

* cited by examiner $$D = 1/2 \; W \; H \; F \; \rho \; V^2$$

PHOTOVOLTAIC BUILDING MATERIAL WITH ABILITY OF SAFE ELECTRIC POWER GENERATION

CROSS-REFERENCE TO RELATED APPLICATION

This application is based upon and claims the priority benefit of Japanese Application No. 2020-002820, filed on Jul. 9, 2020. The entirety of the above-mentioned patent application is hereby incorporated by reference herein and made a part of this specification.

BACKGROUND OF THE INVENTION

Field of the Invention

The present invention relates to a technical field of power generating building materials, especially a kind of photovoltaic building material which is waterproof, fireproof, load-bearing, durable, heat-insulating, and satisfying the requirements of the performance of building materials, and is able to fit in with the automatic spraying device in order to achieve the safe solar power generating functions of roof cleaning and cooling down by automatic water spraying.

Background

A structure of a photovoltaic (PV) module in the prior art consists of front panel glass, front Ethylene Vinyl Acetate (EVA) plastic film, silicon solar cell, back EVA plastic film and polyethylene terephthalate (PET) back plate assembled and laminated, and covered by four sides of aluminum alloy frame. Therefore, a traditional solar photovoltaic (PV) module product is created. While the double-sided glass module is with a glass back plate substituted for a PET back plate module.

At present, all kinds of Building Integrated Photovoltaic (BIPV) module products still take the main purpose of photovoltaic power generation from the product designing, and then think how to integrate with existing building. Wherein said BIPV module system is formed through adjusting a short frame of the traditional PV module product so as to collocate a water guiding groove under the PV module through the module product with a frame element overlapped between upper portion and bottom portion. A so-called BIPV system is formed through assembling the existing PV module above the water guiding groove. Substantially, the said products are Building Attached Photovoltaic (BAPV) products, and are unable to replace roof. The existing main application is recognized as BIPV products. However, the basic functions required for roof materials of the building including heat insulation, waterproof, durability, fireproof, load-bearing ability and other basic requirements are not fulfilled by these modified products.

In addition, traditional glazed tiles or clay tiles are replaced by small tiles made of clay or composite material, which is assembled with about 2-6 solar cells on each tile and forming small-sized solar photovoltaic tiles, but this modified process is still a traditional high voltage direct current system, and because of each tile is concatenated and many power supply adapters are used, loosening or even a fire hazard caused by short circuit may easily be resulted from strong wind, sunlight or rain. Small photovoltaic tiles are only capable of being used for replacing the roof made of traditional glazed tiles or clay tiles, such roofs have a larger slope (20%-30% above) and are not capable of being collocated general low-slope industrial or commercial roofs (average slopes of 5%-10%). It is difficult to be applied to such roofs. The cost is higher, and the installation capacity per square meter is small (30-40 W/m$^2$) such that the guaranteed investment efficiency is difficult to be achieved.

However, in actual use, there are several issues resulted from these traditional BIVP products or systems as below.

1. The waterproof effect is not good, i.e., a closed roof structure may be not formed by the assembling method of the traditional module collocated the water guiding groove, and a closed system is not formed from the roof structure system resulting from leakage from a gap between the module and the water guiding groove, therefore the entry of rainwater is not capable of being fundamentally prevented, and it is impossible to stop moisture from entering inside the roof.

2. The material and structure do not meet the requirements of fire certification. The back plate of the traditional module is an organic material, and the additional EVA and solar cells are all combustible materials. Therefore, there is a serious safety concerns when these are installed on the bottom of the roof the roof. Such products and roof systems are currently unable to pass the fire acceptance criteria. Familiarly, a double-sided glass module is still unable to meet the requirements of fireproof ability because its back plate is glass.

3. Unable to bear load. It is generally required that a live load on the roof should not be less than 30 kg/m$^2$, that is, people can walk on the roof so as to maintain the roof. For example, the standard of a live load that required by a color steel tile is 35 kg/m$^2$. However, the traditional module is unable to bear a weight of person, and only wind load 20 kg/m$^2$ is taken into account by the uniform load. An internal structure of the module is unable to bear a pressure for mankind walking on it. Therefore, it is necessary to install or retain the maintenance passage on the roof, resulting in low utilization of the roof area for solar power generation and causing about 100-120 W/m$^2$ of an actual installation capacity per square meter.

With the rapid development of distributed photovoltaic applications and photovoltaic roof systems, a general technology of module products improvement is unable to meet the functional requirements of roof, such as insulation, waterproof, durability, fireproof, load-bearing, etc.

Series connection is always used by a conventional photovoltaic module cell in the prior art, when cells in the series circuit are covered by shadow, the covered cells may turn into a power consumption unit from a power generation unit, consuming the power generated from other cells and generating heat, i.e., a so-called Hot Spot effect, and may generate high temperature and result in a fire hazard in severe condition.

A bottom assembling mode is always used by a DC lead-out circuit of a conventional solar power generation in the prior art, i.e., a DC circuit is led from the bottom side of the photovoltaic module and is connected. All the joints are exposed in the space between the solar panel and the roof, such that a high voltage DC arc is easily formed, and a fire hazard is easily caused.

High voltage DC is formed through superimposing dozens of pieces of the photovoltaic module of a solar power generation DC lead-out circuit in the prior art, and a DC voltage level reaches to levels of 1000V and/or 1500V, thereby causing the solar panels on the roof to be in a high voltage state. Once a high-voltage connector is loose or detached, a high-voltage DC arc is easily to formed, and the DC arc reaches to 3000° C., a roof fire hazard is easily caused.

For example, a double-glass BIPV photovoltaic module of the prior art comprises a glass panel, a high light transmitting EVA film, a plurality of solar cells, an anti-ultraviolet EVA film and a back plate superimposed from top to bottom. Said solar cells are uniformly distributed in multiple rows and columns, and a light-transmitting interval is provided between the solar cells. Said technology is sealed by the EVA film, but waterproof and durability thereof is not better than the Polyolefin elastomers (POE) film, and the side bonding is inconvenient. A plastic film formed by EVA is unable to be exposed to the air in long time, and may be hydrolysed and turn in yellow after contacting with water in a few months, thereby the functions of protecting solar cells and light transmittance ability are loosed, and bonding force may also be incredibly reduced.

By way of example, a BIPV module of the prior art comprises a front glass, a solar cell and a back glass, overall materials are laminated together into a module, and the solar cells are connected by a solder ribbon. After adding a color or black-and-white plastic plate or plastic film the same as the size and shape of the cell onto the back of each one of the cells, the original gray, solder ribbon and welding surface of the back cell sheet are all covered without being exposed to air. Said technology is still inconvenient to do packaging with bad waterproof and low durability.

Further by way of example, a photovoltaic tile of the prior art comprises a reinforced glass plate and a solar cell, a raised hem is provided on both sides of the reinforced glass plate, said reinforced glass plate and the two raised hems are an integration structure, and the solar cells in multi rows and columns are provided with an uniform interval above the reinforced glass plate. The solar cells in each row and each column are provided separately. However, there is a connecting end in the said scheme, the connecting end is firmly assembled through ducks, the assembling is not firm enough and not waterproof enough. While the solar cells on two sides of said technology are not sealed by a shell or glue, resulting in short service life and being easy to be destroyed.

Dust pollution caused by bird droppings and dirty air pollution may be easily accumulated on a photovoltaic module system assembled on a roof of the prior art, which seriously affects the power generating efficiency of the photovoltaic module system. Being washed by human or waiting for rain are general solutions, but because of insufficient rainfall for roof washing, power generation of the said system is seriously affected, plus, cleaning staff is forbidden to step on roof, which makes it difficult to clean and expensive.

In addition, because of the frames of the traditional module product, rainwater on the surface of the photovoltaic module will be blocked by a lower frame when the said system is assembled on along a nearly horizontal roof (with a 5-10% slope), which results in a water stain. After evaporating of rainwater, solar cells may be blocked by dust and dirt residues, which finally results in the Hot Spot Effect and malfunction of the photovoltaic module. An assembling method of pigeonholing cast parts at seam, with a huge gap, is used between two modules, generally, a consistent slope surface may not be formed when a gap between modules is within 25 to 30 mm, and rainwater must flow down to roof tiles under the modules or a water-guiding groove through all the gaps between modules, therefore an automatic spraying device may not be used to clean it automatically.

The photovoltaic module of the prior art:

Always uses double-sided tape or glass glue or metal buckle to be fastened and assembled on a color steel tile and with existence of a gap, thereby a serious destruction may be caused when a strong wind goes into the gap.

A traditional photovoltaic module and trestles and buckles of the said module only need to support weight of the photovoltaic module and wind pressure, and no longer able to support the weight and stampede of cleaning stuffs (micro cracks may be easily caused), thereby another maintenance access has to be remained, and a path for strong wind may also be easily formed, causing serious destruction.

If improving efficiency of power generation in high latitude area is intended, reserving an inclination between the photovoltaic module and roof is required while assembling, such an assembling method that enables modules withstand a strong wind more easily and causes destruction.

SUMMARY OF THE INVENTION

A photovoltaic building material which a metal back plate is used to form a roof or wall substrate system covering the exterior of the building and a solar power generation layer is added in order to form a composite material system that a building function is preferentially satisfied while the solar power generation function is fully utilizing, i.e. a photovoltaic building material with ability of safe electric power generation, the photovoltaic building material comprising a metal back plate, a glass plate and a solar cell is provided by the present invention. The glass plate is provided above the metal back plate, and the solar cells are fixed between the back plate and the glass plate through a plastic film, wherein, a fixed part for fixing the photovoltaic building material at building is provided by the back plate.

The photovoltaic building material of the present invention, wherein, the back plate is a metal back plate with a thickness between 0.1 mm and 2 mm, and high rigidity and high strength are provided by the metal back plate, and the load-bearing capacity reaches 70 $kg/m^2$ above, satisfying a requirement of building materials, which is more than 35 $kg/m^2$.

The photovoltaic building material of the present invention, wherein, the plastic film is formed by glue after melting sealing, and a plate with a completely and rigidly sealed edge is formed. The glue is a clear POE/Polyvinyl butyral (PVB) hot-melt adhesive with low moisture transmission rate and high volume resistivity used for replacing traditional EVA packaging materials such that improves the packaging effect.

The photovoltaic building material of the present invention, wherein a quantity of the solar cell is a plurality, and a wire layout between the pluralities of solar cells is a net structure, in order to avoid risk of a fire hazard caused by hot spot effect. Wherein a series circuit between the solar cells may be serially manufactured by a process of soldering circuit or laminae bonding, and a parallel circuit may be parallelly manufactured by a process of conductivity film strip or transfer printing of conductor, in order to form a safe and durable design without hot spot, and said design may be adapted to cell applications with different shape and scale, but it is not limited in the present invention.

Another assembling structure of the photovoltaic building material is provided by the present invention. Besides each one of the examples of the photovoltaic building material as mentioned above, a plurality of the photovoltaic building materials overlapped each other, waterproof cover and self-tapping screw are comprised by the assembling structure of the photovoltaic building material, wherein the fixed part of the photovoltaic building material is overlapped by the fixed part of an another adjacent photovoltaic building material, and the self-tapping screw is provided at the overlapped position, therefore the plurality of photovoltaic building materials overlapped each other are fixed at the building through the self-tapping screw.

The assembling structure of the photovoltaic building material of the present invention, an underside lead-out form can be used by a DC circuit lead-out wire of the photovoltaic building material, wherein a DC circuit lead-out wire passes through an adjacent hole at a grooved edge of a fixed part, enters into a closed slot below the waterproof cover, is assembled inside a groove at an overlapped position of two fixed parts of the photovoltaic building material and forms a closed DC cable slot with the waterproof cover, thus an underside lead-out form is represented. Also, a security technique of low voltage is used by the DC circuit, thus the voltage of the photovoltaic building material is always lower than a safety level of 48V, avoid a fire hazard caused by high voltage DC arc once a connector looses or falls off and is exposed to air.

The assembling structure of the photovoltaic building material in the present invention, wherein, a sealing element is further provided between the glass plate and the flange of the waterproof cover. Besides a function of fixing the waterproof cover, a function of sealing is achieved, and external rainwater is able to be blocked by the overlapped position.

The assembling structure of the photovoltaic building material in the present invention, wherein the overlapped position is formed from a process that a lower photovoltaic building material covered by an upper photovoltaic building material while assembling the photovoltaic building material in vertical direction. There is no any obstacle at the overlapped position and a broad water channel is naturally formed from high to low, which enables rainwater to flow down smoothly, and may prevent rainwater from going into the overlapped position, furthermore, a waterproof sealing element may also be set up at the overlapped position of the upper and lower photovoltaic building materials in order to make rainwater unable to go into the overlapped position, reaching waterproof effect with low slope roof.

At least one stiffening rib is set up at an overlapped position at the metal back plate of the photovoltaic building material of the present invention, which will strengthen rigidity of the overlapped position at the metal back plate to avoid deformation, and at the same time, an upper photovoltaic building material may be raised in order to make rainwater flow easily, and make dust harder to stay.

After the photovoltaic building material in the present invention being assembled, an automatic spraying device is further set up on a ridge of roof, said automatic spraying device is used for cleaning a roof automatically, and for cooling down a roof when roof temperature is high or when indoor temperature requires, reducing indoor temperature indirectly.

An automatic spraying device is further assembled at an adjacent height around the photovoltaic building material of the present invention, specifically is set up at a height of ridge, a kind of usage is rotative watering on a roof, and another kind of usage is punching holes on pipe and then jetting water, directly resulting in a showering effect on the photovoltaic building material, and cleaning the area of photovoltaic building material polluted by accumulated dust and bird dropping, improving efficiency of photovoltaic power generation and cooling down roof temperature simultaneously.

A draining ditch for reclaiming water is set up at a lower portion of a roof, and after reclaiming, rainwater is centralized at a reservoir situated at a lower position under the roof, and may be pump into a ridge/a water pipe height by a water pump set up in the reservoir, and then processes a water spraying. In this way, a cycle of water spraying, cleaning and cooling down, water reclaiming, storing, and pumping into a ridge/a water pipe at height is formed.

A filtering system is in a water tank, foreign matter on the roof may be filtered before going into the water pump.

Electrical control of the water pump is controlled by an intelligent system, and it may process a programming control which is based on roof temperature, indoor temperature and analogy prediction of power generation in order to realize intelligent control without need for manual operation.

Compared with the prior art, the present invention is able to be used as building materials by itself through the metal back plate and/or the plastic film, etc., and the present invention is quick and easy to be installed, and building performance requirements of heat-insulation, waterproof, fireproof, durability and load-bearing ability are satisfied. Traditional building materials are replaced by an intelligent roof power generation system formed by the automatic spraying device and the photovoltaic building material, and a photovoltaic module system set up on traditional roof tiles is also be replaced, realizing a real integration of roof building materials and photovoltaic, and also realizing a safe photoelectric roof which is intelligent power generating, waterproof, fireproof, load-bearing, durable, and heat insulation.

Compared with the prior art, the photovoltaic building material of the present invention is integrated, and a metal back plate has been used to form a roof or wall substrate system covering the exterior of the building and a solar power generation layer is added in order to form a composite material system that a building function is preferentially satisfied while the solar power generation function is fully utilizing, i.e., a photovoltaic building material used for the building material, the photovoltaic building material comprising a metal back plate, a glass plate, and a solar cell is provided by the present invention. The glass plate is provided above the backplate, and the solar cells fixed between the back plate and the glass plate through a plastic film, wherein, a fixed part for fixing the photovoltaic building material at a building is provided by the back plate, making it such a structure that completely none of interval, maintenance trail and inclination angle, and prevent it from a destruction caused by winds going into interval.

Except for features of the said photovoltaic building material, an auxiliary accessories are provided by the present invention:

A Reverse Wing device assembled on a main structure is used for generating downforce that pushing a building down in cases of a strong wind is flowing over devices in order to prevent a roof formed by the photovoltaic building materials from being destroyed by the strong wind. Or a plurality of wind power generators arranged in array type on edge of roof are used for forming a wind wall structure in order to reduce damage to roof caused by strong wind velocity.

2. On the principle of spoiler, a plurality of cable trays forming aerodynamics spoilers is assembled on edge of a roof or on a roof in order to reduce destructive power acting on the roof when spoilers destroy strong wind field by forming turbulence while wind is passing through the cable trays.

3. On the principle of spoiler, a cable tray is assembled on a ridge in order to reduce destructive power acting on the roof when a spoiler destroys the strong wind field by forming turbulence while airflow coming out the cable trays.

BRIEF DESCRIPTION OF THE DRAWINGS

FIG. 3-1 is a cross-section schematic view from B-B' section of a back plate of the photovoltaic building material with underside lead-out form in the present invention.

FIG. 3-2 is a cross-section schematic view from A-A' section of a back plate of the photovoltaic building material with underside lead-out form in the present invention.

FIG. 3-3 is a cross-section schematic view from C-C' section of a back plate of the photovoltaic building material in the present invention.

FIG. 3-4 is a schematic view of fixed parts and a waterproof cover of the photovoltaic building material in the present invention.

FIG. 4 is a cross-section partial profile of the photovoltaic building material in the present invention.

FIG. 7-1 is a schematic view of an assembling structure of the photovoltaic building material with underside lead-out form in the present invention.

FIG. 7-2 is a schematic view of an overlapped fixed part of the photovoltaic building material with underside lead-out form showing before and after overlapping in the present invention.

FIG. 8-1 is an overlap schematic view of the photovoltaic building material while assembling along with the rainwater in the present invention.

FIG. 8-2 is a cross-section schematic view from F-F' section of the assembled photovoltaic building material in the present invention after being passed through by rainwater.

FIG. 10-1 is a schematic view of a rainwater automatic reclaiming and spraying system of the photovoltaic building material in the present invention.

FIG. 10-2 is a schematic view of an assembled water pipe on ridge in the present invention.

FIG. 11-1 is a schematic view of an auxiliary device for resisting strong wind on roof in the present invention.

FIG. 11-2 is a cross-section schematic view from G-G' section of an auxiliary device for resisting strong wind on roof in the present invention.

DESCRIPTION OF EMBODIMENTS

The following provides a detailed description of the embodiments along with the accompanied drawings to facilitate the understanding of the technical features and effects of the present invention.

Figure 1:
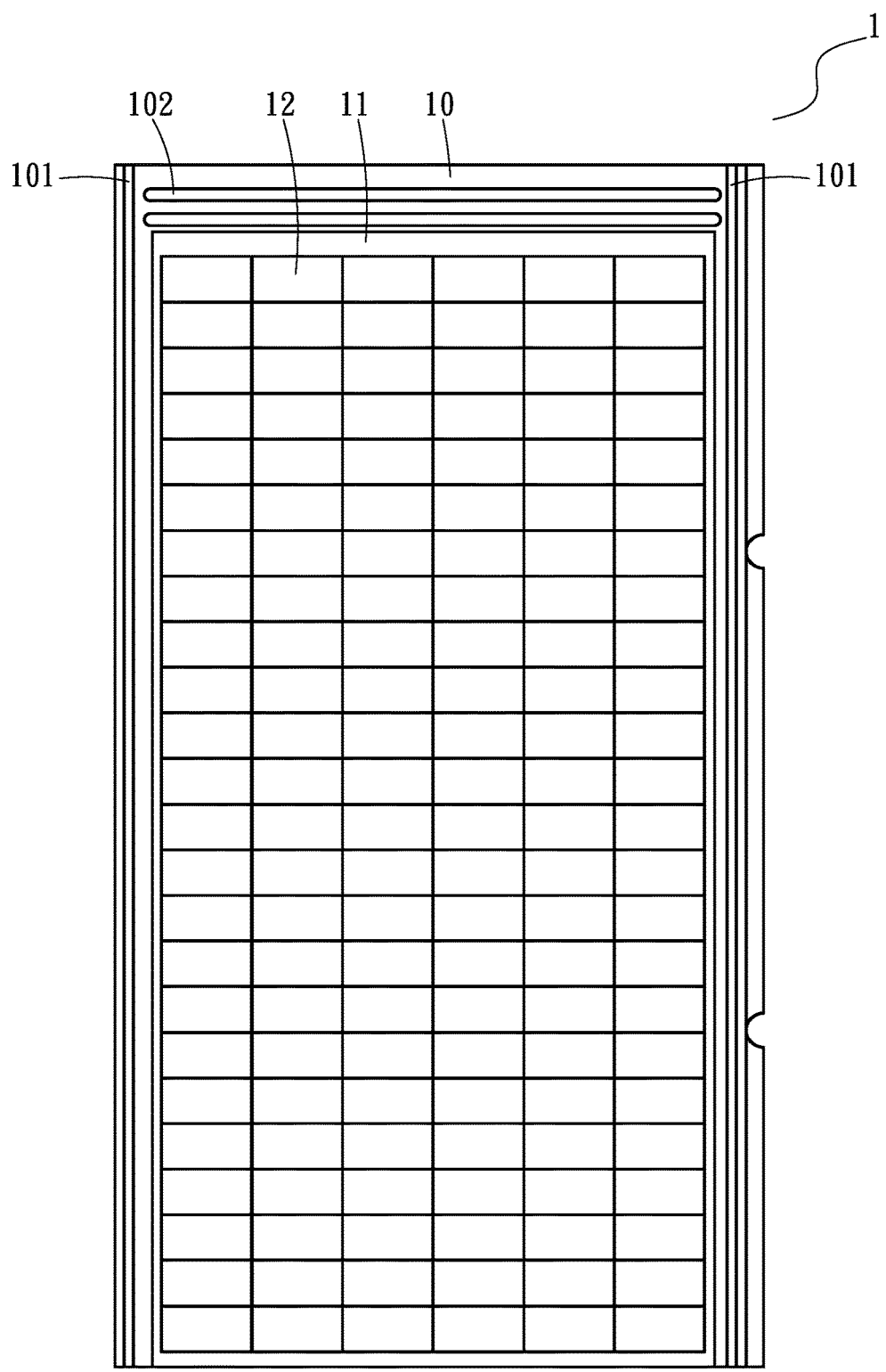
FIG. 1 is a top view of the photovoltaic building material with underside lead-out form in the present invention.

Please refer to FIG. 1, it is a top view of a photovoltaic building material 1 in the present invention. A metal back plate 10, a glass plate 11, a solar cell 12 and a plastic film 13 showing in FIG. 4 may be comprised of photovoltaic building material 1 of the present invention, wherein the metal back plate 10 and the glass plate are fireproof or non-combustible materials. The metal back plate 10 as mentioned above may be a metal back plate with a thickness 2 mm and 0.1 mm in order to bear most of the range forces applied through the glass plate 11 by an external source, therefore, a problem of rupture caused by a usage of organic materials or glasses in the prior art is avoided, and the photovoltaic building material 1 is able to be substituted for a steel tile.

Figure 2:
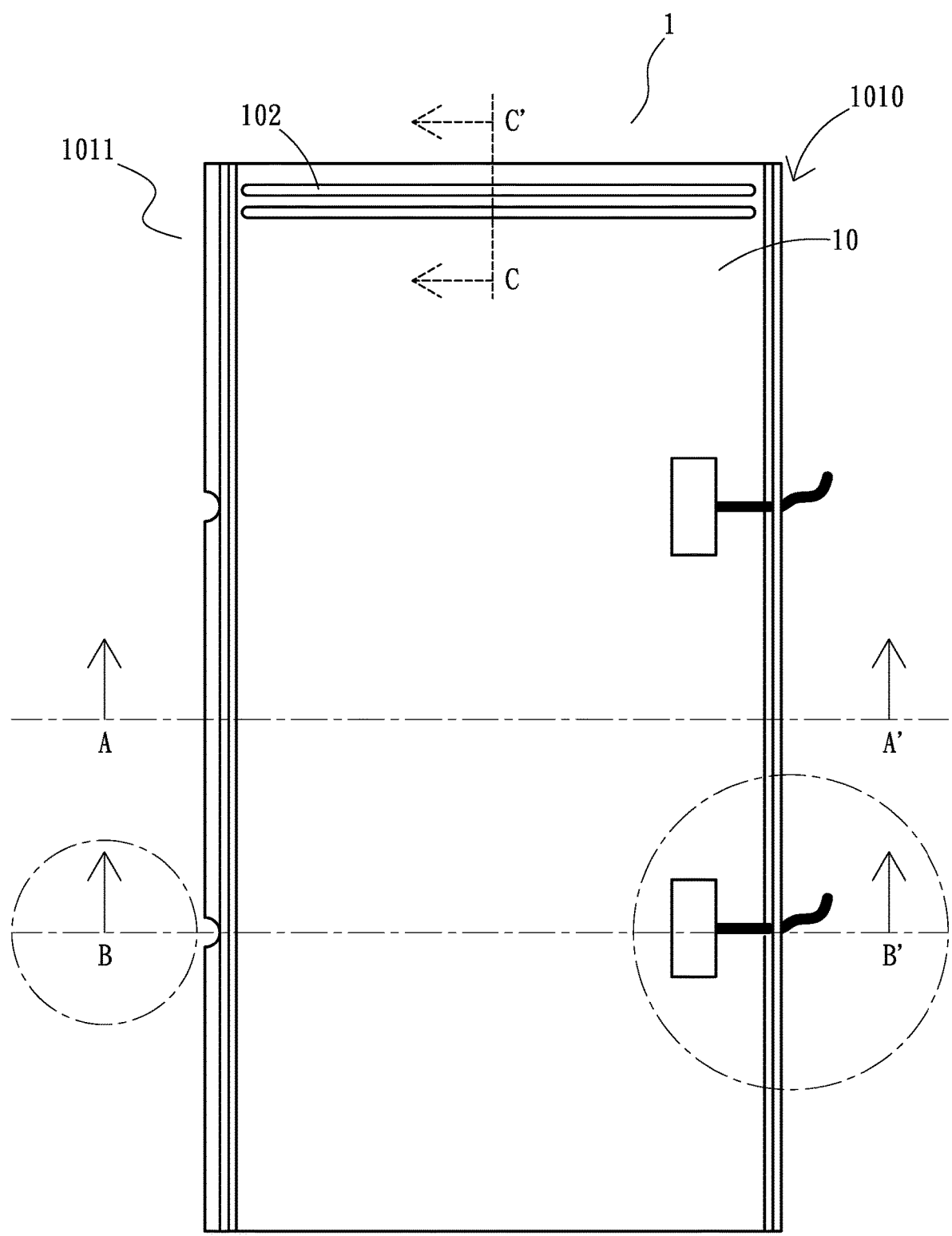
FIG. 2 is a back view of the photovoltaic building material with underside lead-out form in the present invention.
Figures 1, 7:
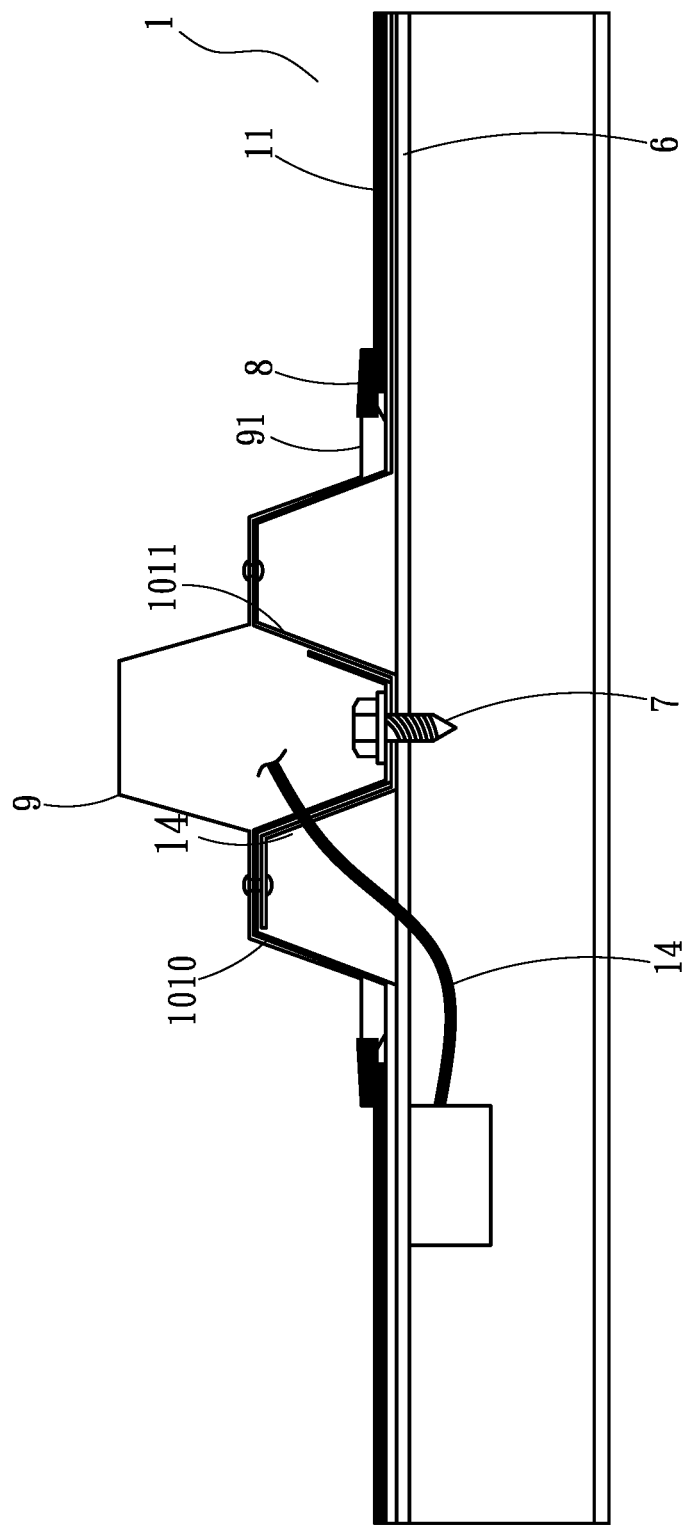
Figures 2, 7:
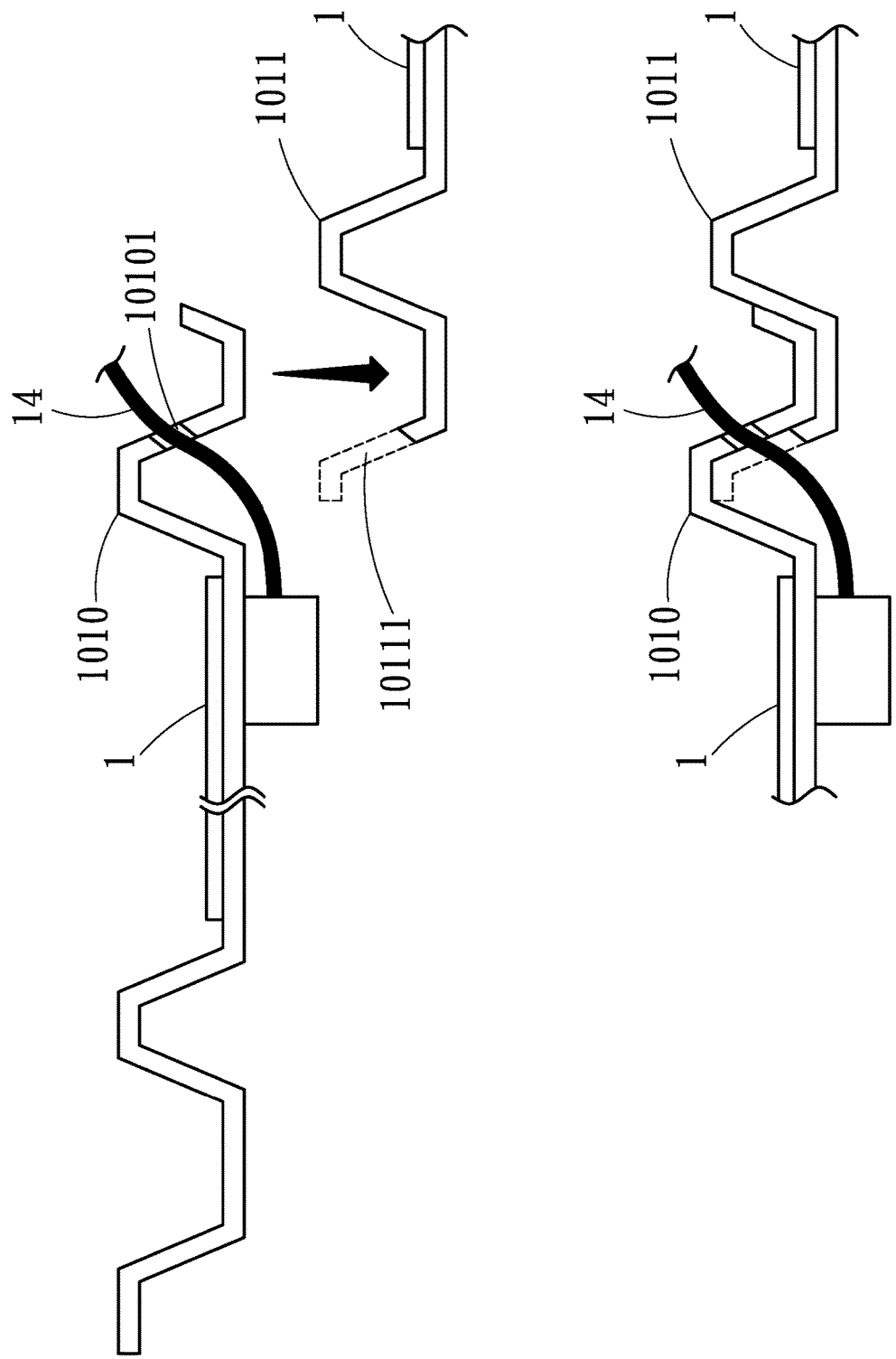
Figures 1, 8:
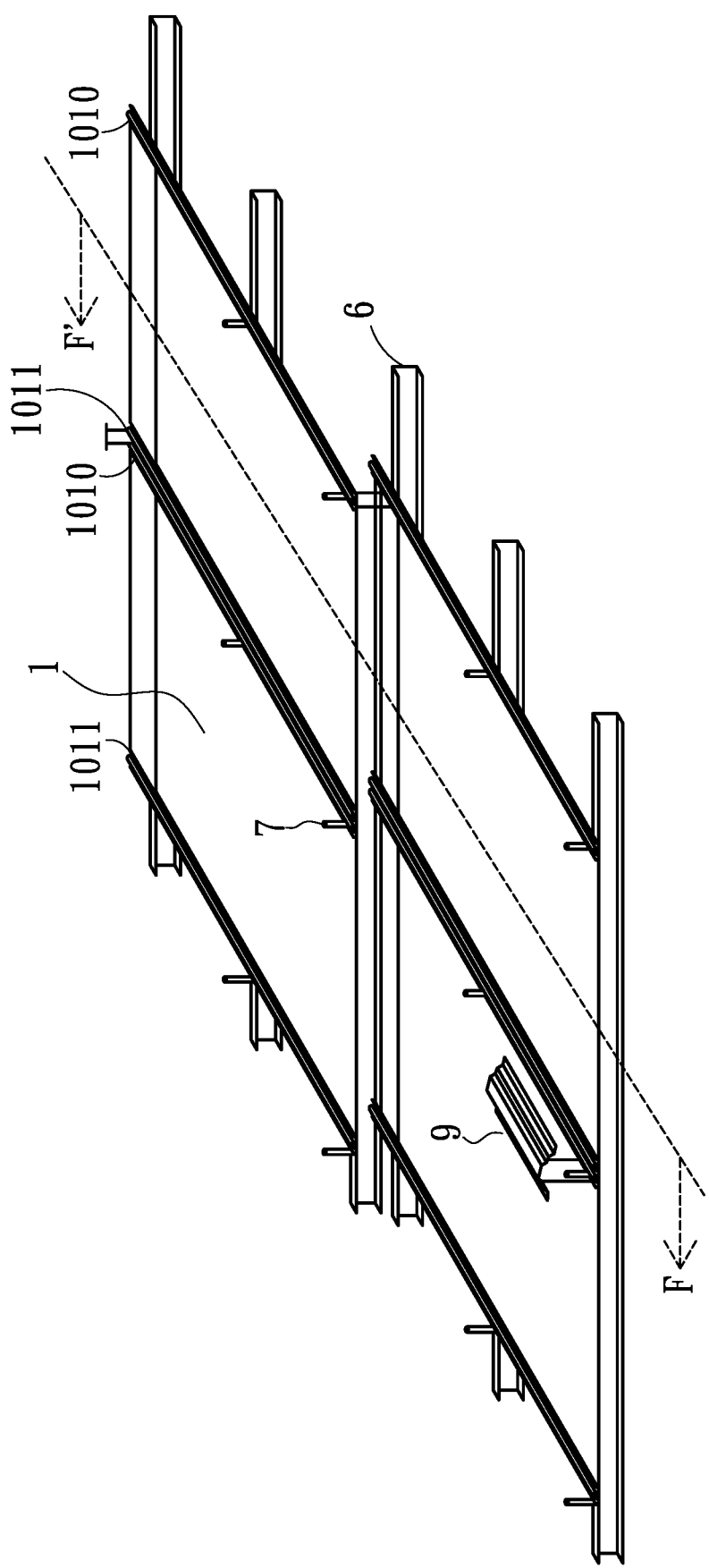
Figures 2, 8:
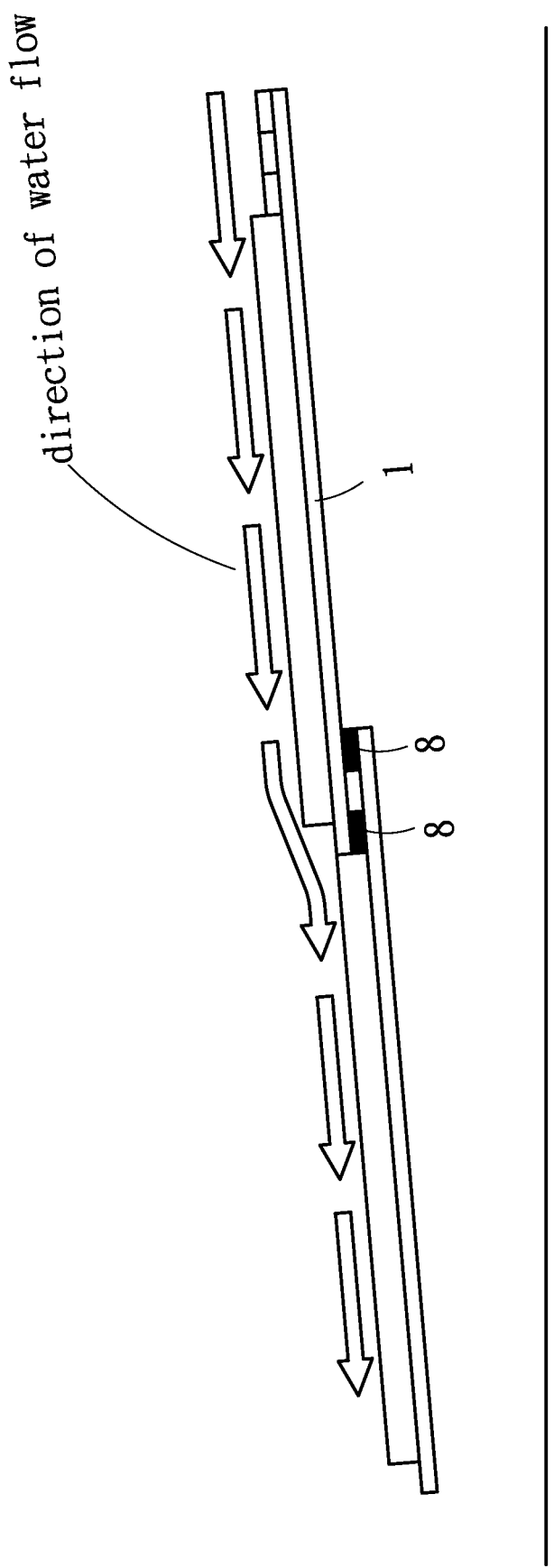

Specifically but not limited to, the metal back plate 10 in the present invention may be an aluminum-zinc alloy coated steel sheet, a zinc-coated steel sheet, a stainless steel, a color steel sheet, an aluminum-magnesium alloy sheet, an aluminum alloy sheet, a, an aluminum-magnesium-manganese alloy sheet, etc. In addition, a fixed part 101 for fixing the metal back plate 10 at a building may be provided by the back plate 10. More particularly but not limited to, shapes of the fixed part 101 may be W, V or the combination thereof, and the back plate 10 and the fixed part 101 may be an overall same material and integrated together. Refer FIG. 2, FIG. 3-1, FIG. 3-2 and FIG. 3-4 to be an example, a V shaped fixed part 1010 and a W shaped fixed part 1011 may be provided by the opposite two sides of the photovoltaic building material 1 respectively, such an underside lead-out form as shown in FIG. 7-2, but it is not limited in the present invention.

Specifically but not limited to, the solar cell 12 may be a regular single crystalline-silicon cell, a polysilicon cell, a Passivated emitter rear contact (PERC) cell, a Heterojunction with Intrinsic Thin layer (HIT/HJT) cell, an Interdigitated Back Contact (IBC cell), a Copper indium gallium selenide (CIGS) cell, a thin-film micro crystal silicon cell, a perovskite cell etc., but it is not limited in the present invention.

Specifically but not limited to, the glass plate 11 may be a regular ultra-clear glass, a solar glass with nano-coating, an ultra-thin glass composed of organic and inorganic materials, a film plating glass reflecting infrared ray or a complexed transparent material with weathering resistance over 20 years, but it is not limited in the present invention.

Specifically but not limited to, the plastic film 13 may be a specially made POE film, a complexed film composed of POE+PVB, or a complexed film composed of POE+PVB+ reducing infrared spectrum reflection, but it is not limited in the present invention.

The solar cell 12 as mentioned above may be fixed between the metal back plate 10 and the glass plate 11 through the plastic film 13. Specifically but not limited to, the plastic film 13 may extend from the top side of top surface of the solar cell 12 and along the lateral side onto surface of the metal back plate 10, and a part of the plastic film 13 is positioned between the solar cell 12 and the glass plate 11. Showing in FIG. 4, the plastic film 13 may extend along the lateral side and onto the surface of the back plate 10, such that the solar cell 12 is surrounded by the plastic film 13. Or the plastic film 13 may extend along the lateral side and onto a position of the back plate 10 without being covered by the solar cell 12, such that the solar cell 12 is fastened onto the back plate 10 by the plastic film 13. The plastic film 13 may be formed by self-melting glue after sealing, and a plate with a completely and rigidly sealed edge may be formed by the back plate 10, the glass plate 11 and the self-melting glue after the sealing. In the condition that a wire led from the solar cell 12 and through the plastic film 13, a plate with completely and rigidly sealed edge except for an opening connected to the outside may be at least formed by the plastic film 13 and the back plate 10, i.e., the wire of the solar cell 12 may be led to outside through the opening. In addition, the glue may be a clear POE/PVB hot-melt film, but it is not limited in the present.

A heat resistant temperature may be increased through performing a crosslinking reaction for POE/PVB in the present invention, therefore resulting in a reduced permanent deformation, and resulting in greatly improved tensile strength, tear strength, etc. of major mechanical properties. Good performances such as aging resistant, ozone resistant, chemical resistant, etc. are presented through POE/PVB after the crosslinking reaction. The greatest advantages of the POE/PVB plastic film are low-moisture transmission rate and high-volume resistivity, such that the safety operation under high temperature-high humidity and long-term aging resistance of photovoltaic building material 1 are proven, and the photovoltaic building material 1 is capable of using for at least 25 years. Specifically speaking, the better performance comparing the photovoltaic building material 1 sealed by POE/PVB plastic film to the same sealed by EVA plastic film are as below.

1. The POE plastic film is a copolymer of ethylene and octane and has less Tertiary carbon atom in the molecular chain. Good weatherability, UV aging resistance, excellent heat resistance, low-temperature resistance are represented. Therefore, a better aging resistance than an EVA plastic film is represented by the POE plastic film. PVB is used for interlayer film of a fireproof and bulletproof safety glass, has a long history and outstanding thermoset, thermal stability and bonding performance.

A bonding force between the POE/PVB plastic film and the glass plate 11, and the metal back plate 10 is improved through a modification method such as a photo-grafting polymerization monomer, plasma surface treatment or reactive graft modification etc., therefore there is a good interface bonding performance in the present invention.

3. The POE/PVB plastic film with a lower water vapor transmission rate and a greater cohesive force is more suitable for building-integrated modules. A combination of the glass plate 11 and the metal back plate 10 is a research and development result of the present invention, such that the extra sealing edge is not required and service life is longer in the manufacturing of building-integrated modules.

Figure 5:
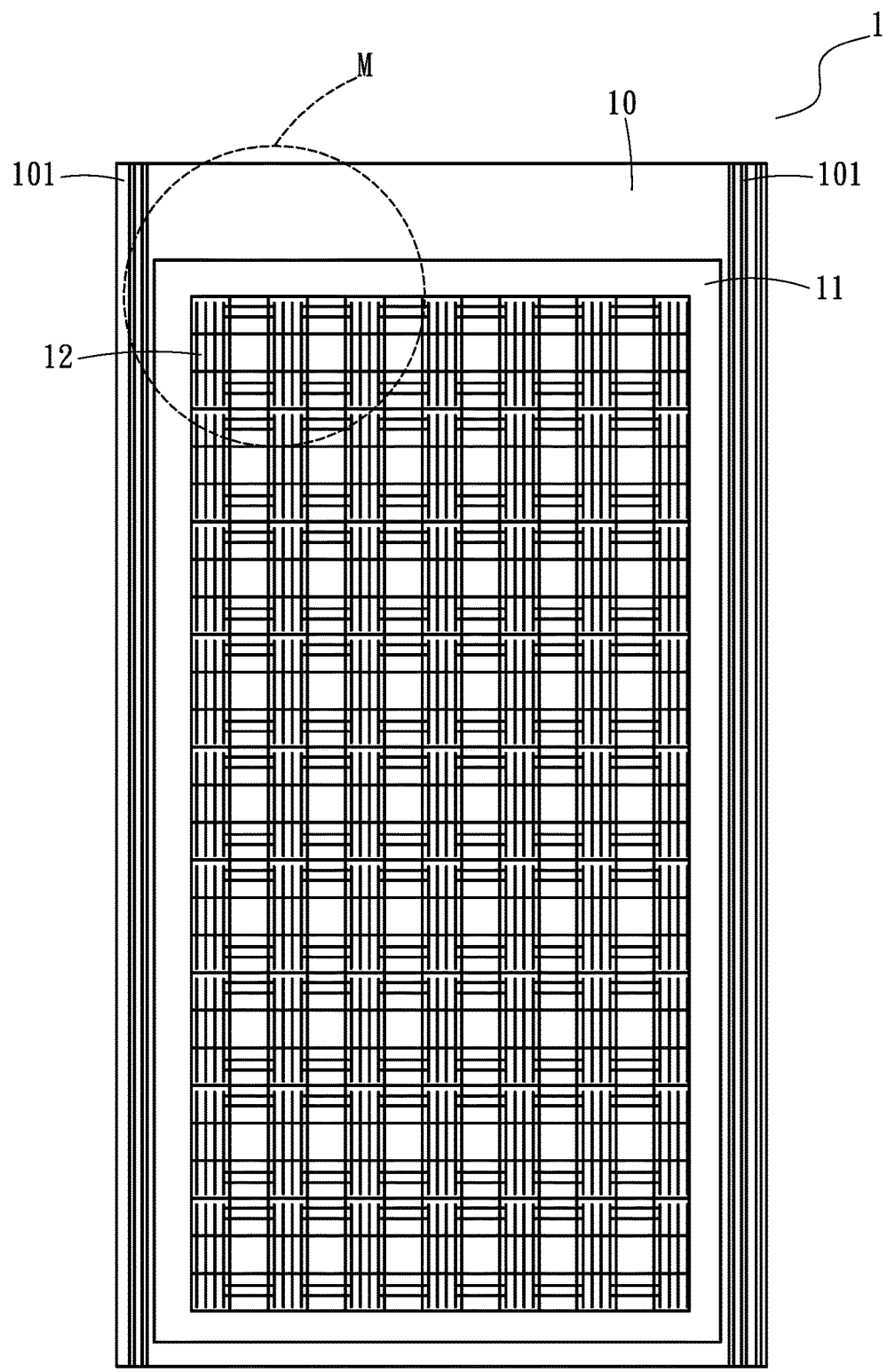
FIG. 5 is an arrangement schematic view of solar cells of the photovoltaic building material in the present invention.
Figure 6:
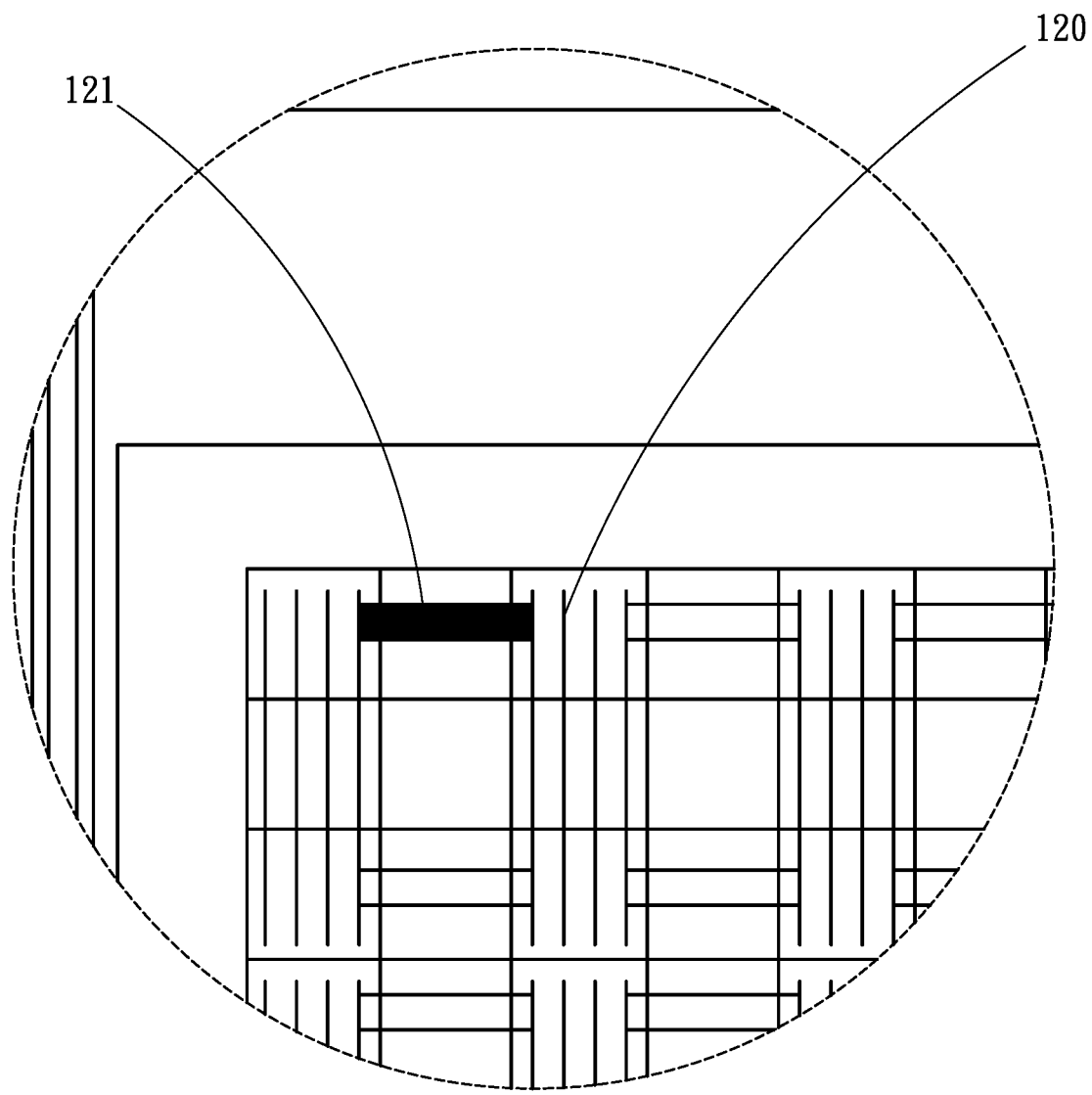
FIG. 6 is a partial zoom-in schematic view of M in FIG. 5.

As showing in FIG. 5, if a quantity of the solar cell 12, a wire layout between the pluralities of solar cells 12 is a net structure. Specifically but not limited to, a serial-parallel net structure may be used by the net structure, for example, a parallel circuit is further provided based on a serial circuit. For example, if a rectangle net connection is formed between the pluralities of solar cells 12, except for the solar cell 12 in a corner, each one of the other solar cells 12 are connected to at least three solar cells 12. If the other shaped net connection is formed between the pluralities of solar cells 12, each one of the most solar cells 12 are connected to at least three solar cells 12. A zoom-in location M as showing in FIG. 5 and a zoom-in FIG. 6 thereof, the plurality of solar cells 12 forming the net connection may be connected by a back-connection wire of the cell 121 or a front connection wire of the cell 120. A solar cell 12 wire layout of the present invention ensures that there are more than three wires guiding current in the most cells by the usage of the net structure instead of traditional series connection structure wire layout, and the back-connection wire of the cell 121 may connected by one of a process of conductivity film strip or transfer printing conductor, therefore heating resulted from loading (i.e., hot spot effect) resulted from the shade is prevented.

In addition, the glass plate 11 may be an ultra-clear glass with a transparent nano-coating (this design complies with the ((technical requirements for reduced reflection coating glass used for crystalline silicon photovoltaic elements)), Standard No. SEMI PV47-0513), i.e., self-cleaning and anti-slip high hardness ultra-thin transparent glass, the surface thereof is processed by embossed, reinforced and sprayed nano-coatings at high temperature, i.e., the light transmission rate is increased to about 95% and the self-cleaning function and the anti-slip function are presented. The glass plate 11 of the present invention is not a regular embossed ultra-transparent glass used for the solar module in the prior art. Therefore, the following effect is representing by the usage of the glass plate 11 in the present invention.

1. Improved light transmission rate, the light transmission rate of the ultra-clear glass is increased by 5% with nano-scale optical coating technology, therefore an output power of the photovoltaic building material 1 is improved.

2. A strong self-cleaning function, good appearance for a long time and a self-cleaning effect for a long time may be maintained by a nano-scale inorganic silicon oxide coating, and a manual cleaning is not required due to an ultra-hydrophilic feature, i.e., a pollution is fallen off in the raining condition by the rainwater self-washing.

3. An improved scratch-resistant hardness, hardness 3H anti-scratch effect may be achieved after strengthening, 4. Coating layer with high chemical stability, high thermal stability, high-temperature variation resistance, aging resistance, acid, and alkali corrosion resistance provides the solar glass to maintain stably clear and anti-pollution performance for a long time in the outdoor application.

Another assembling structure of the photovoltaic building material 1 with underside lead-out form is provided by the present invention. As showing in FIG. 7-1, FIG. 7-2, FIG. 8-1 and FIG. 8-2, and referring to FIG. 1, and FIG. 3-4, a plurality of the photovoltaic building materials 1 overlapped each other, a waterproof cover 9 and a self-tapping screw 7 are comprised of the assembling structure of the photovoltaic building material 1. Wherein the fixed part 101 of the photovoltaic building material 1 is overlapped by another adjacent fixed part 101 of photovoltaic building material 1, and the self-tapping screw 7 is provided at the overlapped position. The plurality of photovoltaic building materials 1 overlapped each other are fixed at the building 6 through the self-tapping screw 7. As showing in FIG. 2, FIG. 3-1, FIG. 3-2 and FIG. 7-2, a lead-out wire 14 passes through a circular hole 10101 of a V shaped fixed part 1010 of the photovoltaic building material 1, and the V shaped fixed part 1010 is overlapped onto an another adjacent W shaped fixed part 1011 of the photovoltaic building material 1 in vertical direction, and at the same time, a lead-out wire 14 may pass through a circular hole 10101 of the V shaped fixed part 1010 and an U shaped hole 10111 of the W shaped fixed part 1011 without interference. For example, a position where the building 6 and the photovoltaic building material 1 are fixed may be a purlin structure of a roof, but it is not limited in the present invention. In addition, when the photovoltaic building material 1 of the present invention is assembled, it is only required to perform assembling with single construction surface and standing on the roof through the usage of a connection between the self-tapping screw and the purlin of the roof instead of complicated ducks mounting or bolt-nut through connection.

In particular but not limited to, as showing in FIG. 3-4 and FIG. 7-1, an engagement groove bent inward is provided by the waterproof cover 9, and a flange 91 extending outward is provided at two sides of the engagement groove. The engagement groove is provided above the overlapped position of the plurality of V-shaped fixed parts 1010 and the plurality of W-shaped fixed parts 1011, and the flanges 91 at two sides of the engagement groove are respectively fixed at the glass plate 11 of the plurality of adjacent photovoltaic building materials 1. In addition, a waterproof sealing element 8 is further provided between the glass plate 11 and the flange 91 of the waterproof cover 9. Furthermore, the waterproof cover 9 may be independent of the photovoltaic building material 1 so as to be replaced and may be made of different colors of various materials or different colors of metal material, for example, a yellow mark for alarming electric wire passes through or a brightly colored mark for alarming dangerous area.

Specifically but not limited to, an underside lead-out form is used based on a lead-out wire 14 of the photovoltaic building material 1, the lead-out wire 14 passes through an adjacent circular hole 10101 of a V shaped fixed part 1010 and enters into a closed slot below the waterproof cover 9, is assembled inside a groove at an overlapped position of an U-shaped hole 10111 of a W shaped fixed part 1011 and the V shaped fixed part 1010 and forms a closed DC cable slot with the waterproof cover 9 (closed slot below the waterproof cover 9 in FIG. 7-1), thus an underside lead-out form is represented. Besides, a lead-out wire 14 can also extend to an adjacent groove at an overlapped position of a fixed part of the photovoltaic building material, and forms a closed DC cable slot with the waterproof cover, thus another upper lead-out form is represented. Both lead-out forms could reduce risk of a fire hazard.

As showing in FIG. 7-1, FIG. 8-1 and FIG. 8-2, after the plurality of V-shaped fixed parts of the photovoltaic building material 1 are overlapped onto another adjacent transverse W-shaped fixed part 1011 of the photovoltaic building material vertical direction, the top of the V-shaped fixed part and the W-shaped fixed part are covered by the waterproof cover 9. The waterproof cover 9 is overlapped onto the glass plate 11, and a waterproof sealing element 8 is used at the overlapped position. Effects of simple and reliable waterproof, easily assembling and easily replacing, etc., in the present invention are represented by a usage of overlapping in vertical direction of V shaped fixed part 1010 and W shaped fixed part 1011 of the photovoltaic building material 1 and a usage of connection to building 6. After the photovoltaic building material 1 is assembled, only the self-cleaning and anti-slip high hardness ultra-thin transparent glass surface and the waterproof cover 9 are represented on the building outside surface. It significantly improves weather resistance, self-cleaning performance, sealing performance, waterproof performance, smooth flow of rainwater, etc. of photovoltaic building material 1. At the same time, there is no any obstacle at the overlapped position in vertical direction, and a broad water channel from high to low is naturally formed, such that rainwater may flow down smoothly and take dust on the surface of photovoltaic building material 1 away completely.

Figure 3:
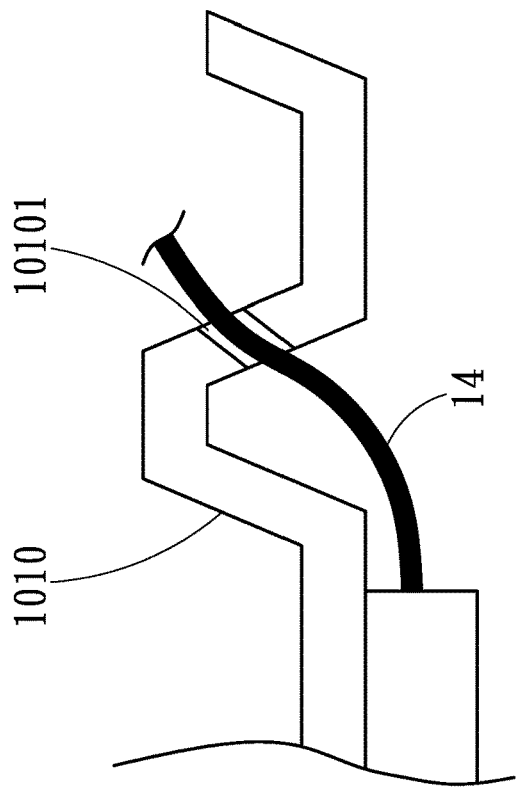
Figure 1:
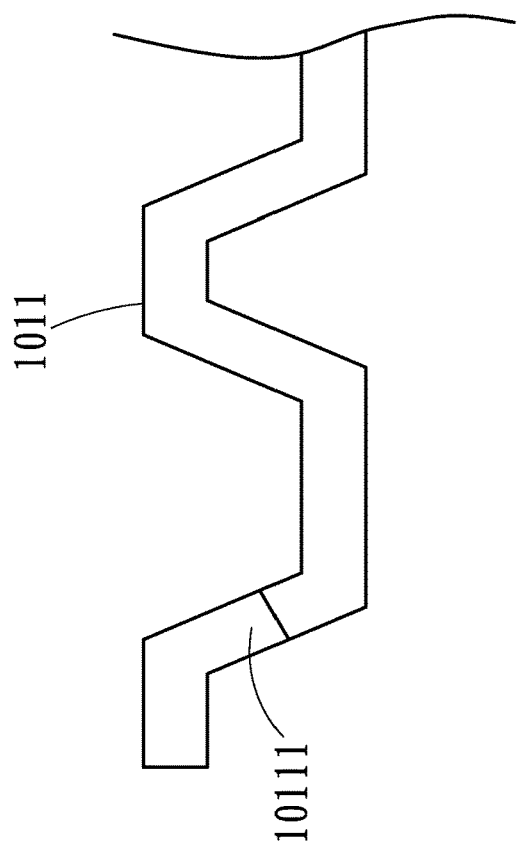
Figures 2, 3:
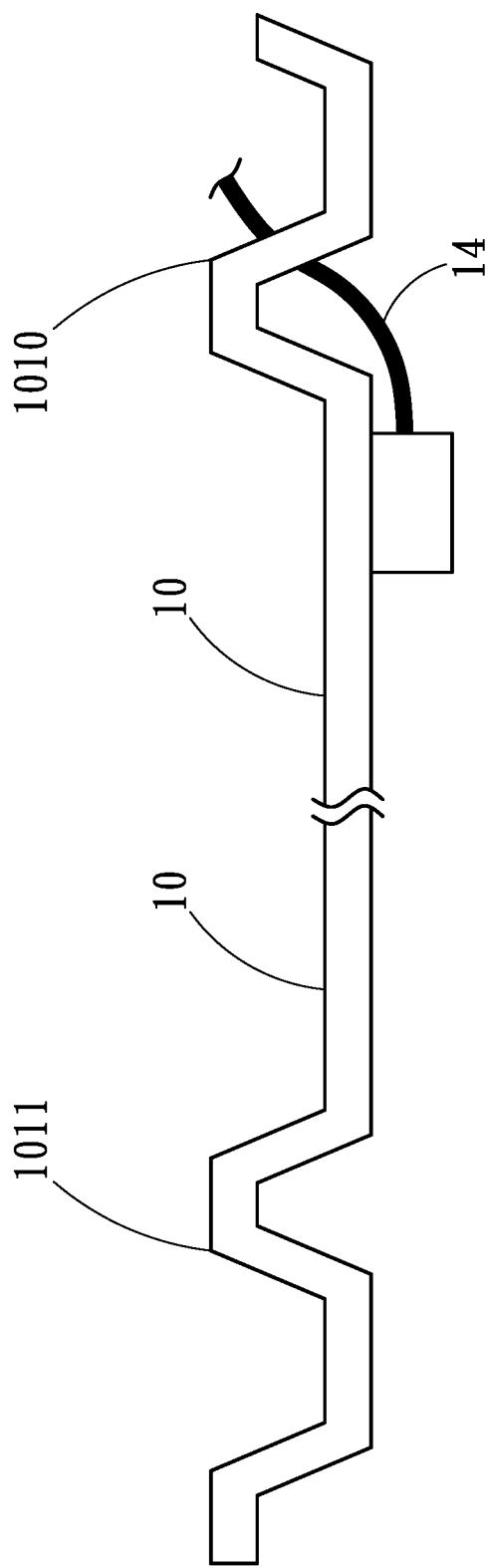
Figure 3:
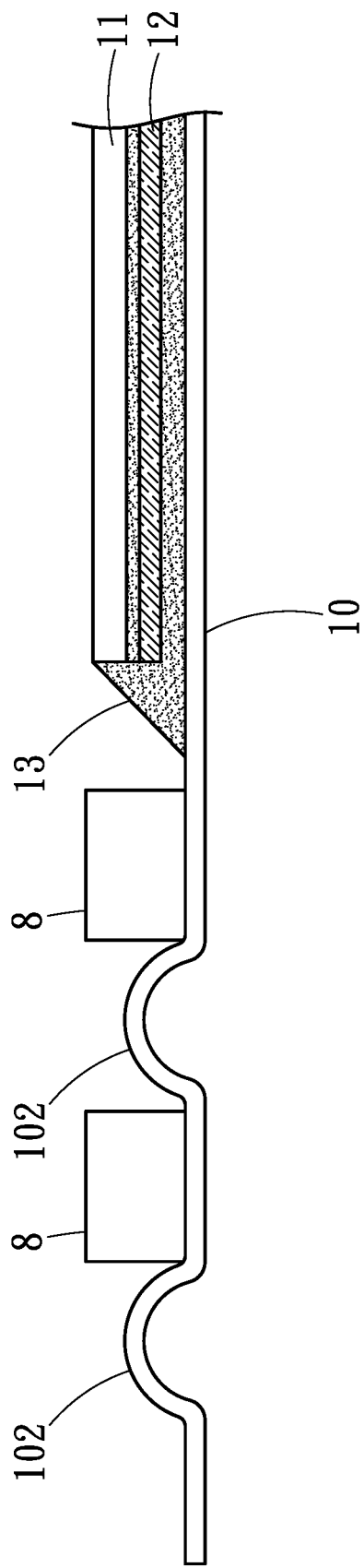
Figures 3, 4:
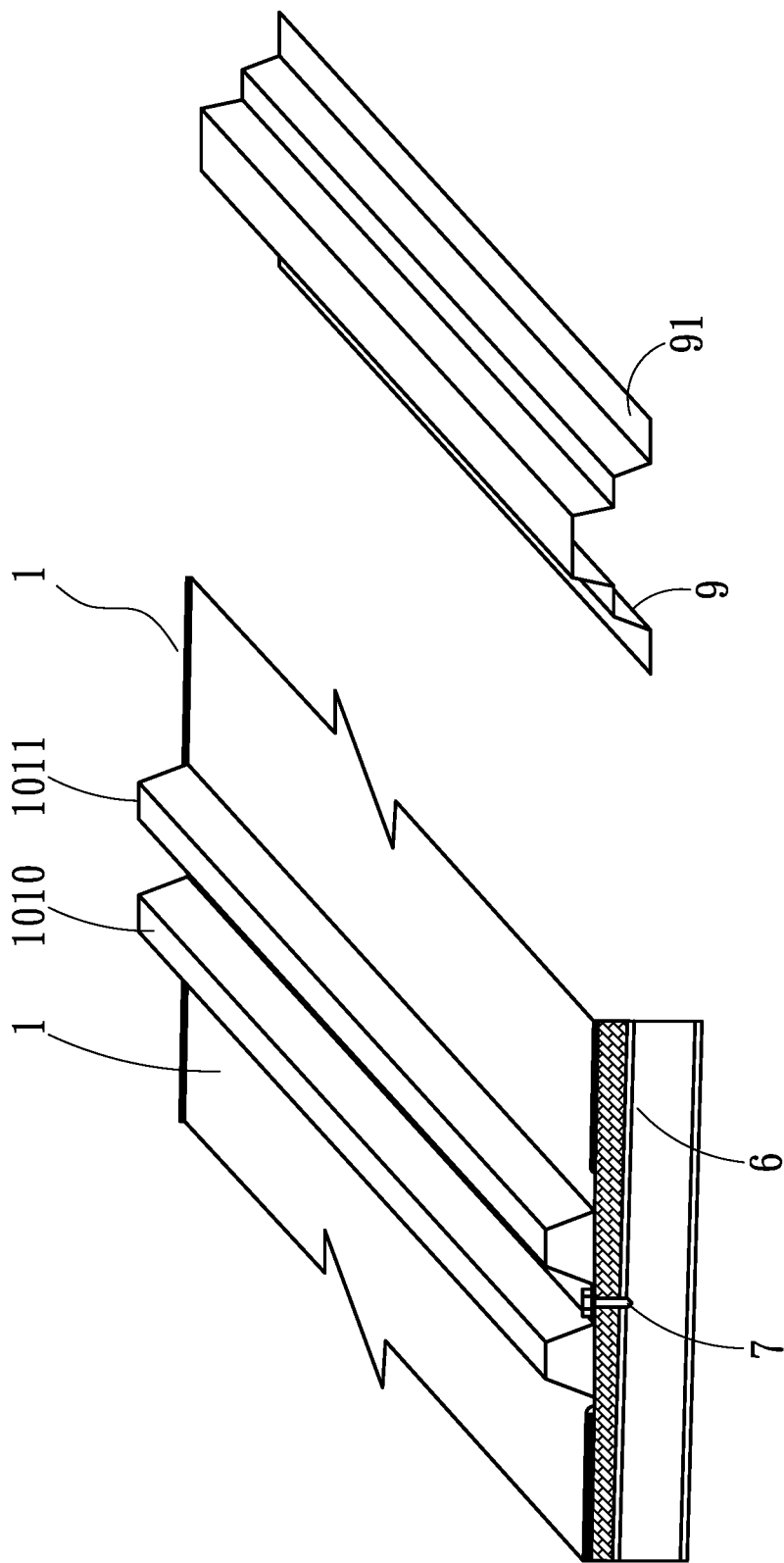
Figure 4:
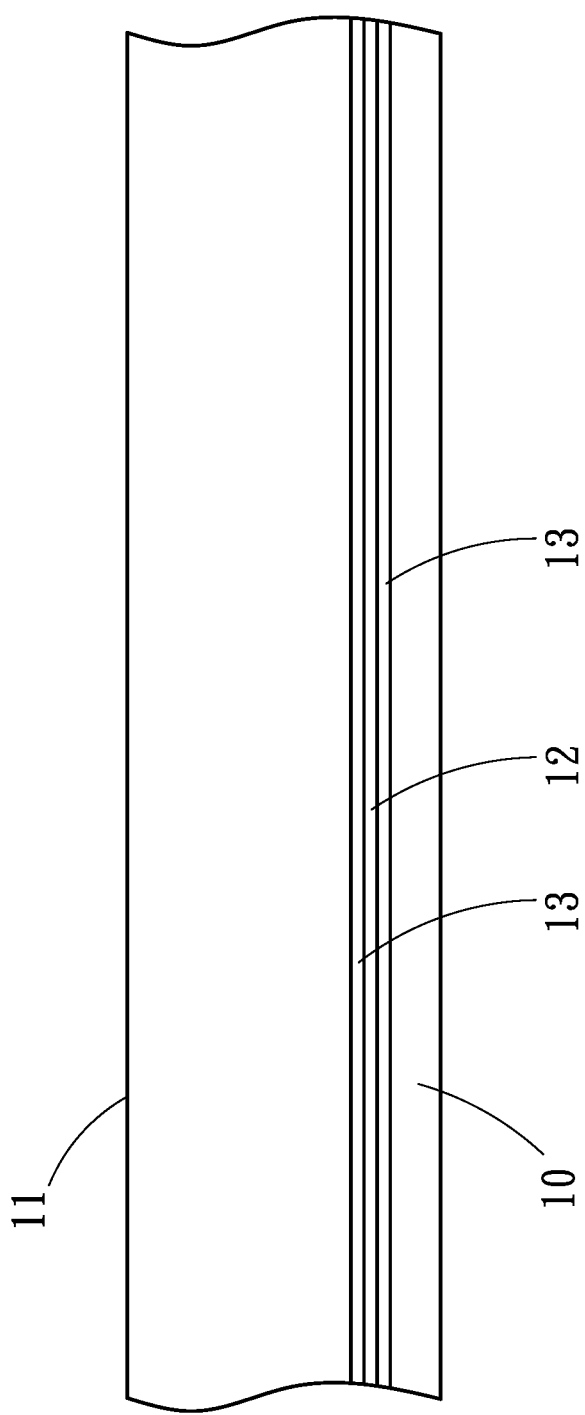

As showing in FIG. 1, FIG. 2 and FIG. 3-3, at least one stiffening rib 102 is further set up at an overlapped position of the metal back plate 10 of the photovoltaic building material 1 in the present invention, which may strengthen rigidity of the overlapped position to avoid deformation, and at the same time, an upper photovoltaic building material may be raised in order to make rainwater flow smoothly, and make dust harder to be residual. Wherein a height of the stiffening rib 102 may less than a thickness of the waterproof sealing element 8, which enables both the upper and bottom photovoltaic building materials 1 to overlap smoothly.

Figure 9:
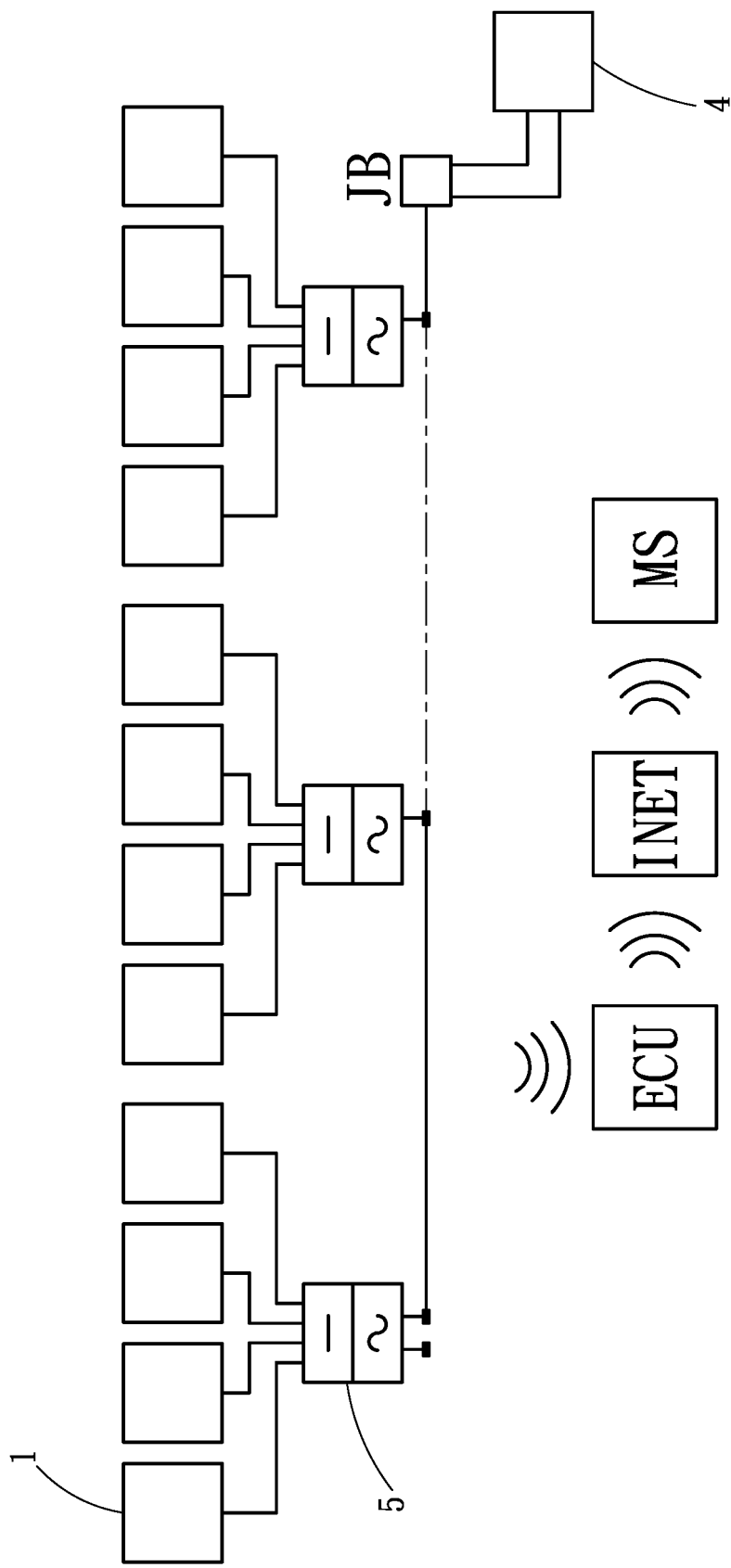
FIG. 9 is a schematic view of the photovoltaic building material while using power generating system in the present invention.

For example, as showing in FIG. 9, after using the photovoltaic building material 1 collocated a micro inverter 5, a traditional color steel tile may be replaced by the photovoltaic building material 1, and a photovoltaic power generation function with the photovoltaic building material 1 will be represented. A direct current with less than a safe DC voltage 48V is generated through a solar cell 12 coupled to a front layer of the photovoltaic building material 1, and the direct current is converted into a 220V or a 380V alternating current by the micro inverter 5 collocated the photovoltaic building material 1, and coupled to an internal power system of the building in order to achieve a power generation function. In addition, a safe low voltage technology is used for the DC circuit of the photovoltaic building material 1. Therefore, a voltage of the photovoltaic building material 1 is always lower than the safety level of 48V.

In conclusion, at least the function of improving the load-bearing ability for building materials and durability is represented by the metal back plate 10 of the present invention. In addition, the effects of aging resistant, ozone resistance, and chemical resistance are further represented by the sealed plastic film 13 of the present invention. Furthermore, the thermo loading resulted from the shade is further prevented by the present invention, and effects of maintaining stable anti-pollution performance, easily assembling, simple and reliable waterproof, easily assembling and using, easily replacing, smooth flow of rain, etc. are provided by the present invention.

After the photovoltaic building material 1 of the present invention is assembled, an automatic spraying device used for cleaning roof automatically may be set up on a ridge or on a height. An automatic water spraying device may have a usage of rotative watering on a roof or a usage of punching holes on pipe channel and water jet, directly resulting in a showering effect on the photovoltaic building material 1, and cleaning the area of photovoltaic power generation, improving efficiency of power generation and cooling down roof temperature simultaneously.

Figures 1, 10:
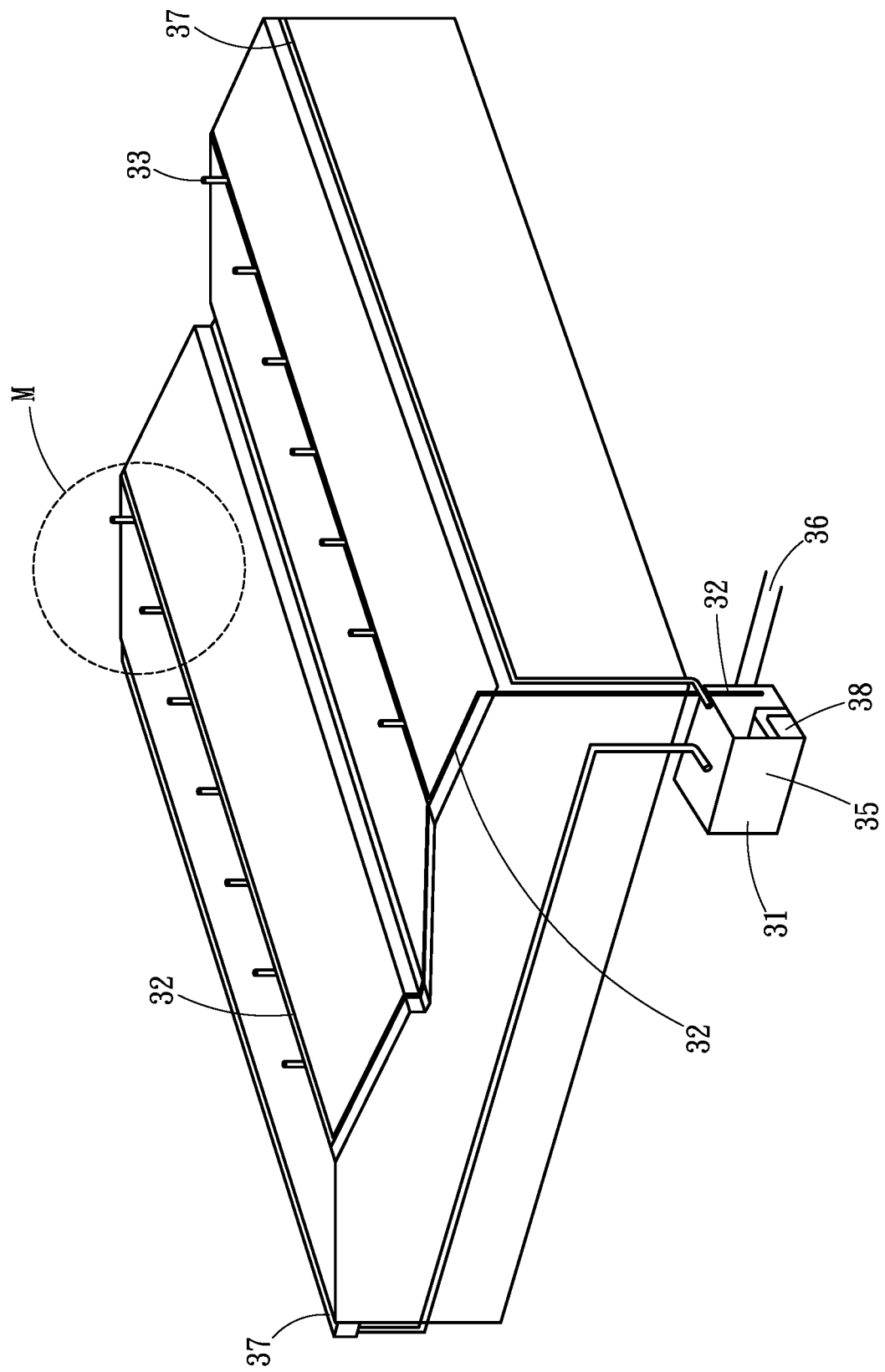
Figures 2, 10:
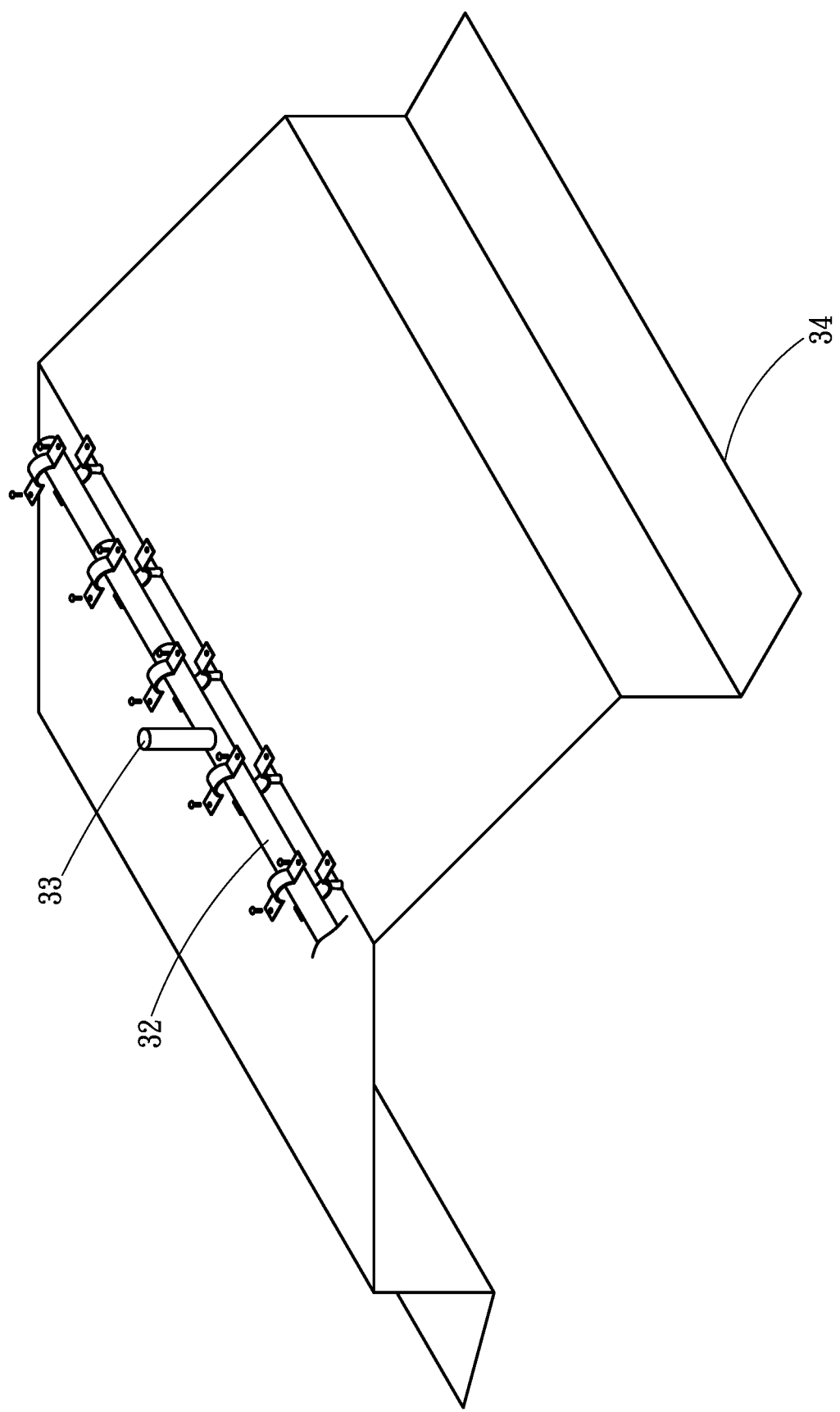

As showing in FIG. 10-1 and FIG. 10-2, a rainwater reclaiming unit or a system of it may be added on the assembling structure of the photovoltaic building material 1 of the present invention in order to realize automatic reclaim of rainwater. A rainwater reclaiming device, a draining ditch 37 for example, is set up at low of roof, after reclaiming, rainwater is centralized at a reservoir 31 situated at a lower position under the roof, and may be pump into a ridge/water pipe 32 at height by a water pump 38 set up in the reservoir 31 in order to provide a water jet to be repeatedly sprayed by an automatic spraying device, and after being collated with a nozzle 33 fixed on a ridge cover plate 34, process water spraying. In this way, a cycle of water spraying, cleaning and cooling down, water reclaiming, and pumping into ridge/water pipe 32 at height is formed. A filtering system 35, which may filter foreign matter of roof in the water body before going into the water pump 38, is in the reservoir 31. If there is no rain for a long time, a public tap-water 36 may be connected with the reservoir 31.

Electrical control of the water pump 38 may be controlled by an intelligent system, and it may be controlled through a temperature detection of a bottom space of the roof, and may process a programming control which is based on roof temperature, indoor temperature and analogy prediction of power generation and turn on an automatically ridge water spraying system when roof temperature is high or when indoor temperature requires, reducing indoor temperature indirectly and realizing an intelligent control without the need for manual operation.

Traditional building materials are replaced by an intelligent roof power generation system formed by the automatic spraying device and photovoltaic building material 1, and the BAPV system set up on traditional photovoltaic module roof is also be improved, realizing a real building integrated photovoltaic and an intelligent photovoltaic roof which is intelligent power generating, waterproof, fireproof, load-bearing, durable, and heat insulation.

Figures 1, 11:
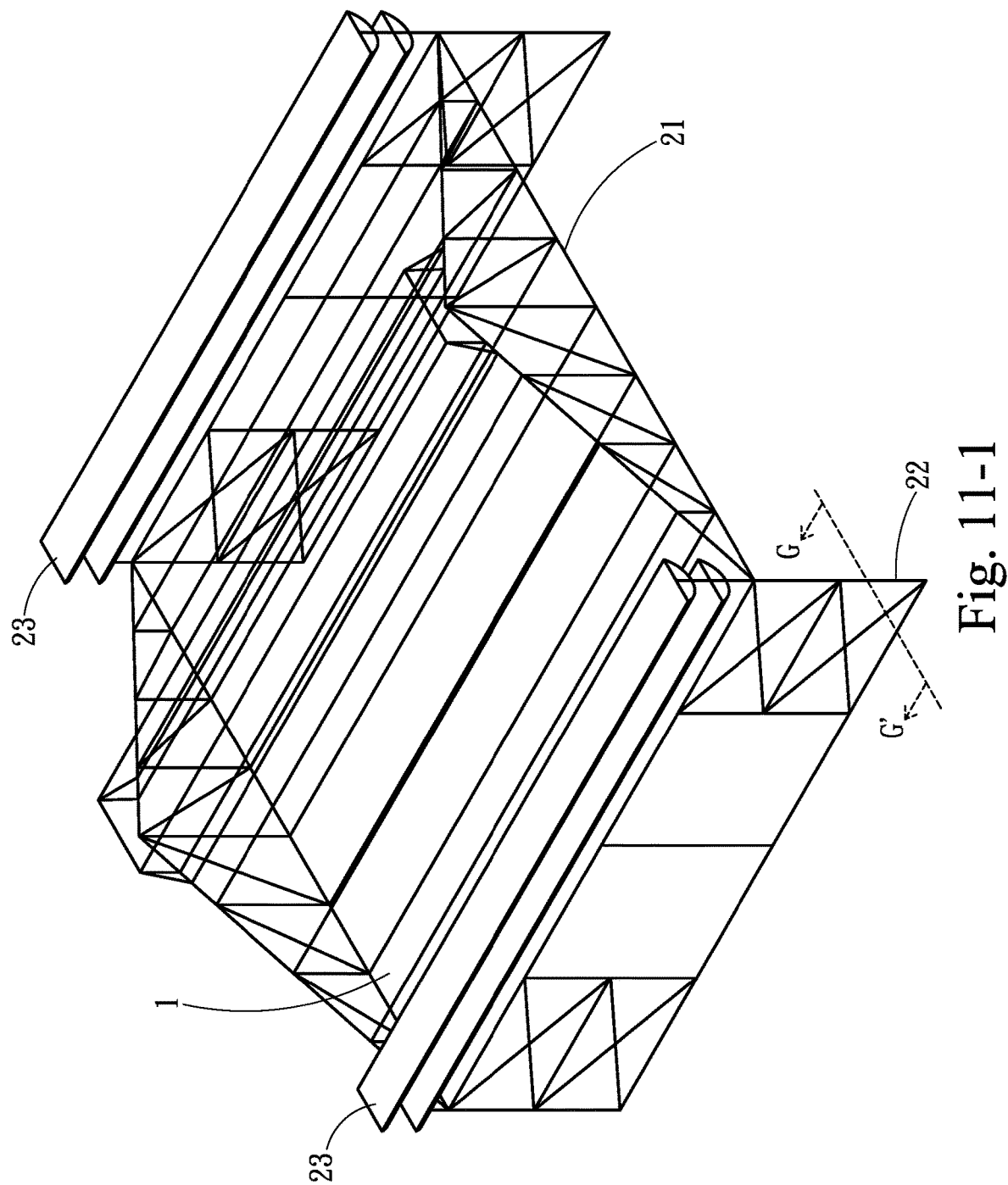
Figures 2, 11:
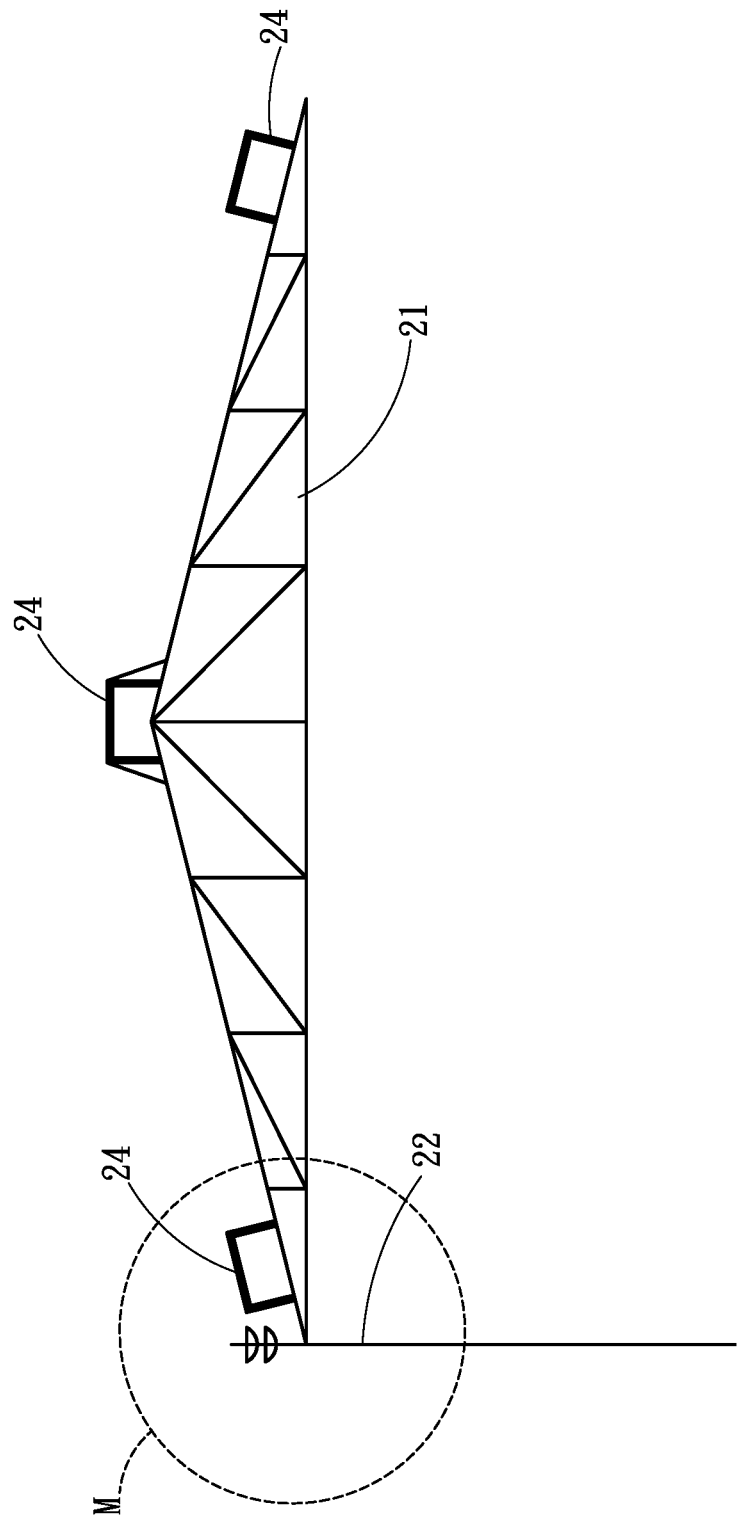
Figure 12:
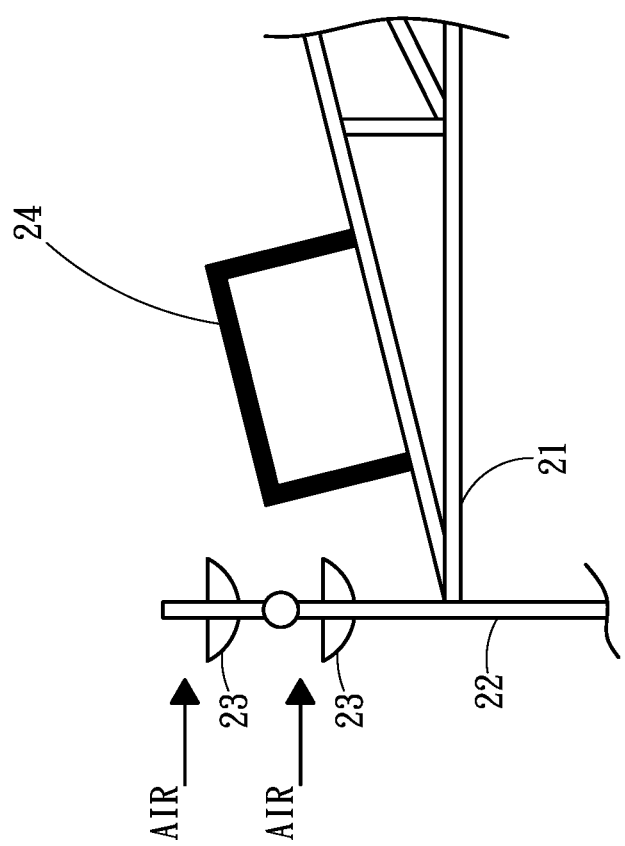
FIG. 12 is a partial zoom-in schematic view of an assembled wind-resisting Reverse Wing device and an assembled wind-resisting cable tray (spoiler) on roof of new building in the present invention.
Figure 13:
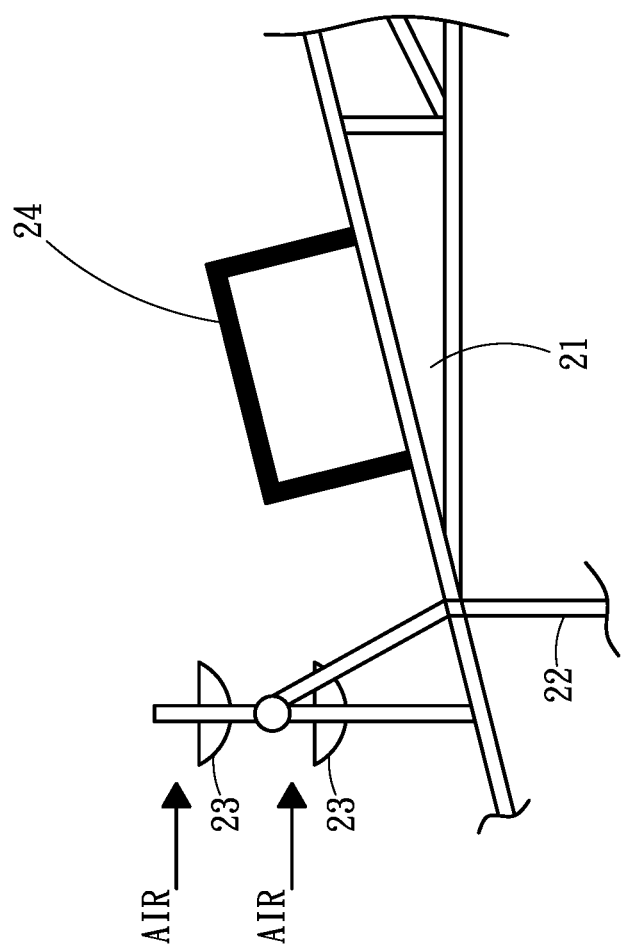
FIG. 13 is a partial zoom-in schematic view of an assembled wind-resisting Reverse Wing device and an assembled wind-resisting cable tray (spoiler) on roof of old building in the present invention.

An auxiliary device for resisting strong wind of the present invention is shown in FIG. 11-1, FIG. 11-2, FIG. 12 and FIG. 13, a reverse wing device 23 is assembled on an upright column 22 of a main structure 21, and two reverse wing devices 23 may be segmentally connected at bottom edge of the main structure 21. FIG. 12 is a reverse wing device 23 assembling method of a design structure of a new building including the main structure 21 and the upright column 22. As showing in FIG. 13, if a design structure of an old building includes the main structure 21 and the upright beam column 22, it may enable the main structure 21 and the upright column 22 to further extend in order to be assembled with a reverse wing device 23. Similarly, the said auxiliary device may be assembled at the other side of building. Also, the said auxiliary device has a function of roof safety rail to prevent workers from falling during maintenance.

A partial zoom-in view of a structure shown in FIG. 11-2 is shown in FIG. 12 is an auxiliary device for resisting strong wind of the present invention, a cable tray 24 (for bearing micro Inverter 5 and wires, and avoiding being grilled) may be assembled on the lower side of the main structure 21, and the cable tray 24 is assembled in a protruding way on top of the photovoltaic building material 1 and is in accord with the principle of aerodynamics spoiler. The protruding cable tray 24 under strong wind may increase air resistance, reduce wind velocity, increase pressure on roof, and reduce damage to the photovoltaic building material 1.

Figure 14:
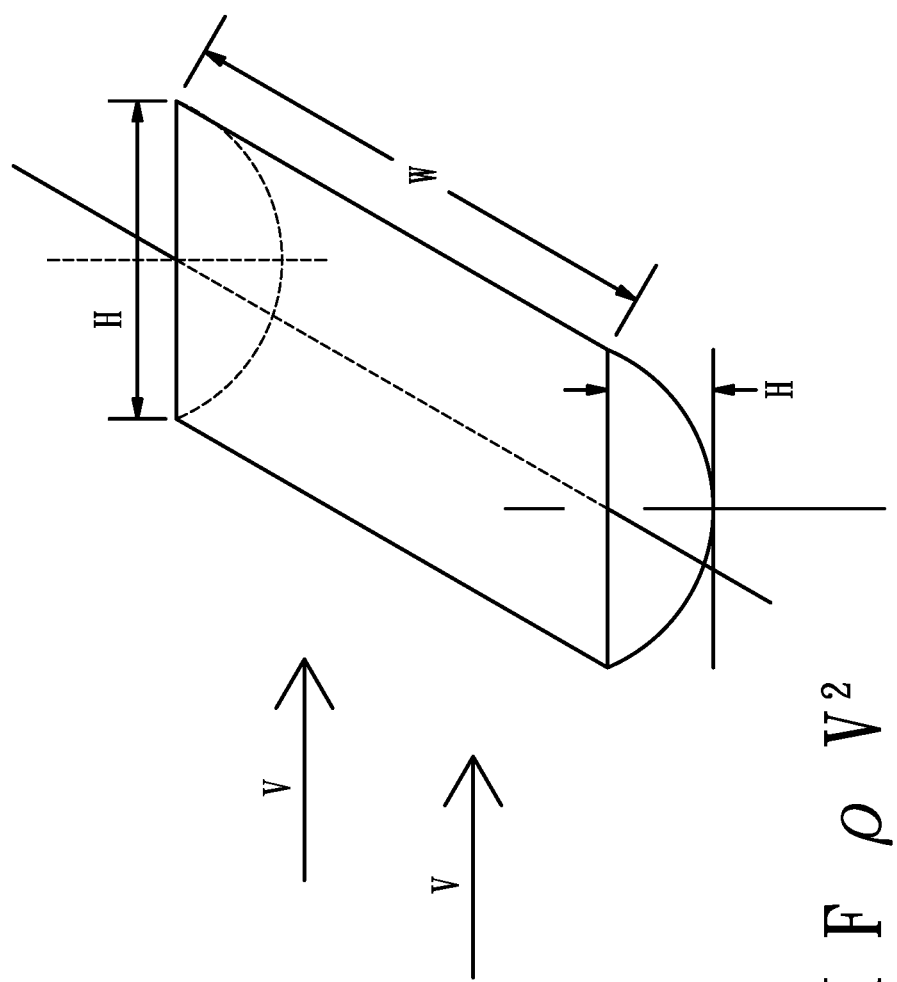
FIG. 14 is a schematic view of an assembled wind-resisting Reverse Wing device on roof in the present invention.

An assembled reverse wing device on a roof for resisting winds of the present invention is shown in FIG. 14, the said device is under a rule of generating a downforce caused by an aerodynamic device with an upside-down wing, and acting the down force on the architecture structure of roof. An uplift force acted on and destroying roof may be formed when a strong wind flows over the roof with a velocity V, but at the same time, when the strong wind flows over the reverse wind device 23, the reverse wind device 23 also acts a down force on the roof structure in order to protect the roof, thereby, a purpose of resisting strong wind for roof building is achieved.

The formula is "$D = \frac{1}{2} W H F \rho V^2$", and meanings of the symbols are as below.

Figure 15:
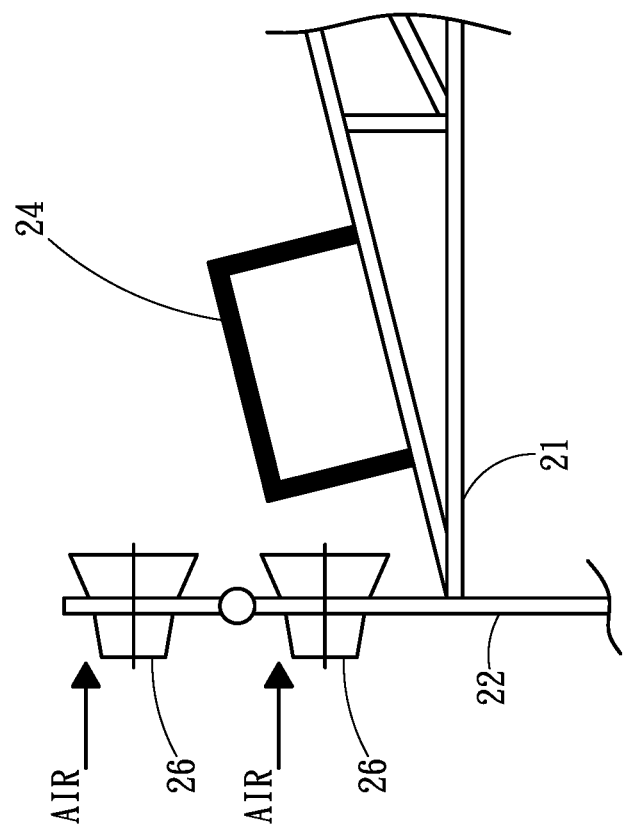
FIG. 15 is a partial zoom-in schematic view of an assembled wind-resisting horizontal axis wind turbine and an assembled wind-resisting cable tray on bottom side of roof in the present invention
Figure 16:
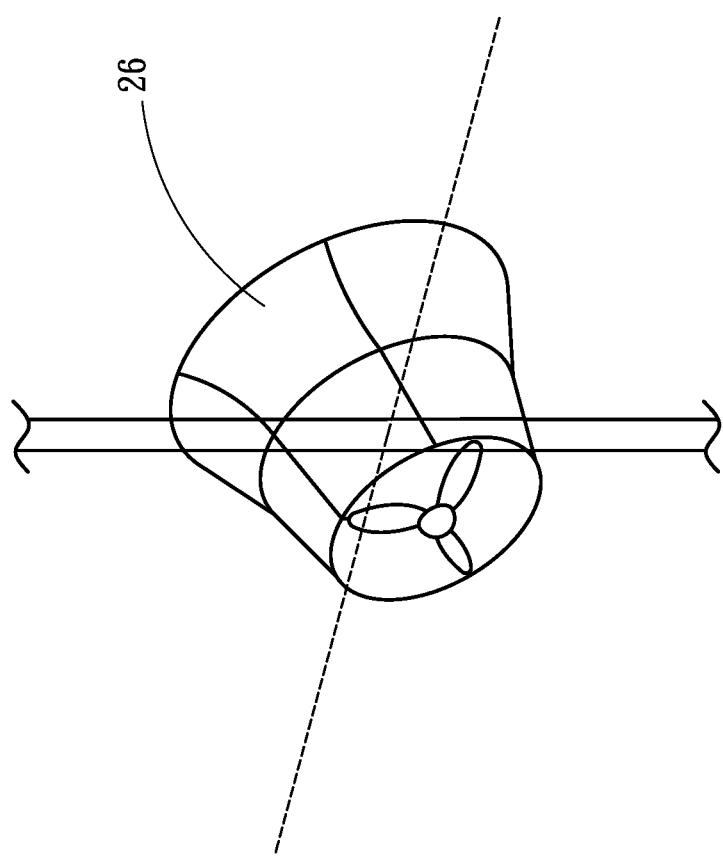
FIG. 16 is a schematic view of an assembled wind-resisting horizontal axis wind turbine in the present invention.
Figure 17:
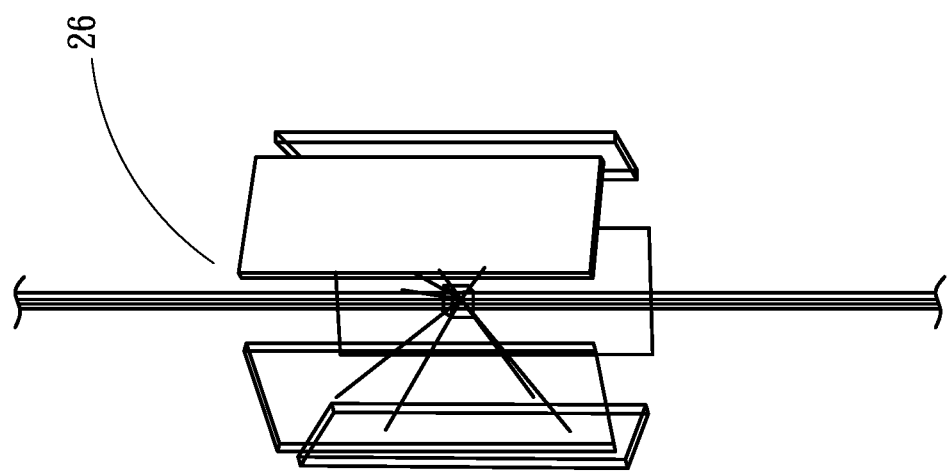
FIG. 17 is a schematic view of an assembled wind-resisting vertical axis wind turbine in the present invention.
Figure 18:
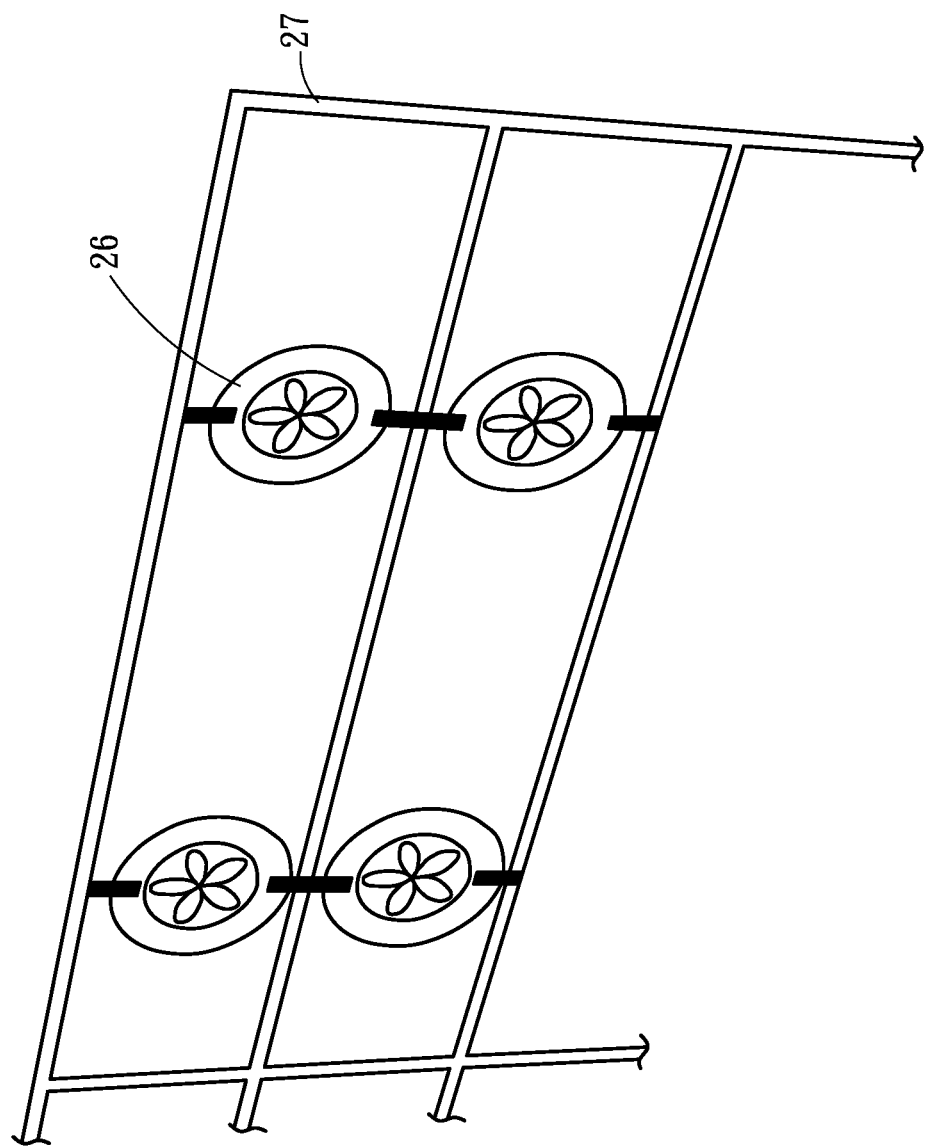
FIG. 18 is a schematic view of a plurality of assembled wind turbine that forming wind turbine wall on roof in the present invention.

D: downforce, SI unit: newton;
W: wing span, SI unit: meter;
H: chord of wing, SI unit: meter;
F: lift coefficient;
$\rho$: air density, SI unit: $kg/m^3$;
V: wind velocity, SI unit: m/sec As showing in FIG. 15, the auxiliary device for resisting strong wind of the present invention may also be replaced by a wind turbine wall 27 composed of a plurality of wind turbines 26 as shown in FIG. 18 at same position, when a strong wind flows through the wind turbine wall 27, velocity of the strong wind will be incredibly reduced in order to prevent the photovoltaic building material 1 from being destroyed, and at the same time, the wind turbines 26 may bring income by producing wind power. Structure types of the wind turbines 26 may be at least segmented into a structure type of horizontal axis wind turbine as shown in FIG. 16 and a structure type of vertical axis wind turbine as shown in FIG. 17.

The above describes the preferred embodiments of the present invention. However, not all of the elements or steps are essential technical features, and all details of the technical features may not have been described completely. All units and steps described are provided as examples only, and they may be modified by a person ordinarily skilled in the art of the technical field of this patent application. The scope of the present invention shall be defined by the claims thereof

What is claimed is:

1. A building system, the system comprising:
a plurality of photovoltaic building components, each photovoltaic building component comprising:
a metal back plate adapted to be fixed to a building through transverse or longitudinal connection;
a glass plate having a nano-coating;
a plastic film connected to a solar cell, the metal back plate and the glass plate, wherein the solar cell is fixed between the metal back plate and the glass plate;
an automatic spraying system disposed proximate the plurality of photovoltaic building components, wherein the automatic spraying system provides a plurality of water jets to apply water over all of the photovoltaic building components;
a reverse wing device attached to the building, the reverse wing device having a plurality of reverse wings, the plurality of reverse wings spaced apart from the building to form a unobstructed gap enabling air to flow through the gap between the reverse wings and the building, each reverse wing having an upper surface and a lower surface, the lower surface having a larger surface area than the upper surface, such that the reverse wing device applies a downforce to the building during a windy weather condition; and
wherein a portion of one of the plurality of photovoltaic building components is disposed overlapping a portion of an adjacent one of the plurality of photovoltaic building components.

2. The system of claim 1, wherein the metal back plate has a thickness of less than or equal to 2 mm and greater than or equal to 0.1 mm, and the metal back plate is one of an aluminum zinc alloy coated steel sheet, a zinc-coated steel sheet, an aluminum-magnesium alloy sheet, an aluminum alloy sheet, a stainless steel sheet, and an aluminum-magnesium-manganese alloy sheet.

3. The system of claim 1, wherein a voltage generated from the photovoltaic building components is less than 48V.

4. The system of claim 1, wherein the solar cell comprises one of a single crystalline-silicon cell, a polysilicon cell, a Passivated Emitter Rear Contact (PERC) cell, a Heterojunction with Intrinsic Thin layer (HIT/HJT) cell, an Interdigitated Back Contact (IBC) cell, a Copper Indium Gallium Selenide (CIGS) cell, a thin-film micro crystal silicon cell, and a perovskite cell.

5. The system of claim 1, wherein the glass plate comprises glass composed of organic and inorganic materials.

6. The system of claim 1, wherein the plastic film comprises a POE film, a PVB film, a film composed of POE+PVB, or a film composed of POE+PVB+a component reducing infrared spectrum reflection.

7. The system of claim 1, wherein an underside DC circuit lead-out wire passes through a hole at a grooved edge of the fixed part of the two adjacent photovoltaic building components, enters into a closed slot below a waterproof cover, is assembled inside a groove at the overlapped portion of the two adjacent photovoltaic building components and forms a closed DC cable slot with the waterproof cover.

8. The system of claim 7, wherein the waterproof cover is independent of the photovoltaic building components, and the waterproof cover has a different color from the photovoltaic building components.

9. The system of claim 1, further comprising a rainwater reclaiming system, wherein the automatic spraying system is connected to the rainwater reclaiming system and the rainwater reclaiming system supplies reclaimed rainwater to the automatic spraying system after the reclaimed rainwater is processed by a filtering system.

10. The system of claim 1, further comprising a plurality of wind turbines.

11. A building system, the system comprising:
a plurality of photovoltaic building components, each photovoltaic building component comprising:
a metal back plate adapted to be fixed to a building through transverse or longitudinal connection;
a glass plate having a nano-coating;
a plastic film connected to a solar cell, the metal back plate and the glass plate, wherein the solar cell is fixed between the metal back plate and the glass plate;
each one of the plurality of photovoltaic building components having a pair of opposing sides oriented in a longitudinal direction and a pair of opposing ends oriented transverse to the opposing sides;
wherein one of the opposing sides of one of the plurality of photovoltaic building components is disposed overlapping one of the opposing sides of an adjacent one of the plurality of photovoltaic building components, and wherein each of the photovoltaic building components has a plurality, of straight stiffening ribs disposed proximate one of the opposing ends of the photovoltaic building component, each of the stiffening ribs extending parallel to the end and substantially all of a distance separating the opposing sides, and at least one waterproof sealing element disposed adjacent and extending along the stiffening ribs.

12. The system of claim 11, wherein the metal back plate has a thickness of less than or equal to 2 mm and greater than or equal to 0.1 mm, and the metal back plate is one of an aluminum zinc alloy coated steel sheet, a zinc-coated steel sheet, an aluminum-magnesium alloy sheet, an aluminum alloy sheet, a stainless steel sheet, and an aluminum-magnesium-manganese alloy sheet.

13. The system of claim 11, wherein a voltage generated from the photovoltaic building components is less than 48V.

14. The system of claim 11, wherein the solar cell comprises one of a single crystalline-silicon cell, a polysilicon cell, a Passivated Emitter Rear Contact (PERC) cell, a Heterojunction with Intrinsic Thin layer (HIT/HJT) cell, an Interdigitated Back Contact (IBC) cell, a Copper Indium Gallium Selenide (CIGS) cell, a thin-film micro crystal silicon cell, and a perovskite cell.

15. The system of claim 11, wherein the glass plate comprises glass composed of organic and inorganic materials.

16. The system of claim 11, wherein the plastic film comprises a POE film, a PVB film, a film composed of POE+PVB, or a film composed of POE+PVB+a component reducing infrared spectrum reflection.

17. The system of claim 11, wherein an underside DC circuit lead-out wire passes through a hole at a grooved edge of the fixed part of the two adjacent photovoltaic building components, enters into a closed slot below a waterproof cover, is assembled inside a groove at the overlapped portion of the two adjacent photovoltaic building components and forms a closed DC cable slot with the waterproof cover.

18. The system of claim 17, wherein the waterproof cover is independent of the photovoltaic building components.

* * * * *